(12) United States Patent
Masuoka et al.

(10) Patent No.: US 10,438,836 B2
(45) Date of Patent: Oct. 8, 2019

(54) METHOD FOR MANUFACTURING A SEMICONDUCTOR DEVICE

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Peninsula Plaza (SG)

(*) Notice: Subject to any disclaimer, the term of this patent is extended or adjusted under 35 U.S.C. 154(b) by 0 days.

(21) Appl. No.: 15/221,077

(22) Filed: Jul. 27, 2016

(65) Prior Publication Data

US 2016/0336218 A1 Nov. 17, 2016

Related U.S. Application Data

(63) Continuation-in-part of application No. 14/272,944, filed on May 8, 2014, which is a continuation of
(Continued)

(51) Int. Cl.
*H01L 21/762* (2006.01)
*H01L 29/66* (2006.01)
(Continued)

(52) U.S. Cl.
CPC .......... *H01L 21/76224* (2013.01); *H01L 21/823431* (2013.01); *H01L 21/823487* (2013.01);
(Continued)

(58) Field of Classification Search
CPC .................................. H01L 27/10882
See application file for complete search history.

(56) References Cited

U.S. PATENT DOCUMENTS 5,382,816 A 1/1995 Mitsui
6,300,198 B1 10/2001 Aeugle et al.
(Continued)

FOREIGN PATENT DOCUMENTS

CN 1251207 4/2000
JP 02-071556 3/1990
(Continued)

OTHER PUBLICATIONS

International Search Report for PCT/JP2012/062597 (including English Translation), dated Aug. 21, 2012, 3 pages.
(Continued)

*Primary Examiner* — Kenneth Parker
*Assistant Examiner* — Christopher A Culbert
(74) *Attorney, Agent, or Firm* — Brinks Gilson & Lione

(57) ABSTRACT

A method for manufacturing a semiconductor device includes etching a semiconductor substrate to form a fin-shaped semiconductor layer. After forming the fin-shaped semiconductor layer, a first insulating film is deposited around the fin-shaped semiconductor layer. The first insulating film is etched back to expose an upper portion of the fin-shaped semiconductor layer and a second resist is formed so as to be perpendicular to the fin-shaped semiconductor layer. The fin-shaped semiconductor layer is etched to form a pillar-shaped semiconductor layer, such that a portion where the fin-shaped semiconductor layer and the second resist intersect at right angles defines the pillar-shaped semiconductor layer.

1 Claim, 42 Drawing Sheets

Related U.S. Application Data application No. 13/666,445, filed on Nov. 1, 2012, now Pat. No. 8,759,178.

(60) Provisional application No. 61/557,501, filed on Nov. 9, 2011.

(51) Int. Cl.
   *H01L 21/8234* (2006.01)
   *H01L 21/8238* (2006.01)
   *H01L 29/423* (2006.01)
   *H01L 29/78* (2006.01)

(52) U.S. Cl.
   CPC ............. *H01L 21/823821* (2013.01); *H01L 21/823885* (2013.01); *H01L 29/4238* (2013.01); *H01L 29/42372* (2013.01); *H01L 29/66545* (2013.01); *H01L 29/66666* (2013.01); *H01L 29/7827* (2013.01); *H01L 29/665* (2013.01)

(56) References Cited

U.S. PATENT DOCUMENTS

| | | |
|---|---|---|
| 6,461,900 B1 | 10/2002 | Sundaresan et al. |
| 6,642,575 B1 | 11/2003 | Ono et al. |
| 6,747,314 B2 | 6/2004 | Sundaresan et al. |
| 7,115,476 B1 | 10/2006 | Izumida |
| 7,262,089 B2 | 8/2007 | Abbott et al. |
| 7,304,343 B2 | 12/2007 | Masuoka et al. |
| 7,348,243 B2 | 3/2008 | Kim |
| 7,442,976 B2 | 10/2008 | Juengling |
| 7,482,229 B2 | 1/2009 | Juengling |
| 7,683,428 B2 | 3/2010 | Chidambarrao et al. |
| 8,080,458 B2 | 12/2011 | Masuoka et al. |
| 2003/0075758 A1 | 4/2003 | Sundaresan et al. |
| 2003/0122200 A1 | 7/2003 | Kamiya et al. |
| 2005/0142771 A1 | 6/2005 | Kim |
| 2005/0224847 A1 | 10/2005 | Masuoka et al. |
| 2006/0046407 A1 | 3/2006 | Juengling |
| 2006/0258109 A1 | 11/2006 | Juengling |
| 2008/0061370 A1 | 3/2008 | Matsuo |
| 2008/0173936 A1 | 7/2008 | Yoon et al. |
| 2009/0042347 A1 | 2/2009 | Oyu |
| 2009/0078993 A1 | 3/2009 | Fujimoto |
| 2009/0096000 A1 | 4/2009 | Juengling |
| 2009/0200604 A1 | 8/2009 | Chidambarrao et al. |
| 2010/0001249 A1* | 1/2010 | Uchiyama ........ H01L 21/823418 257/2 |
| 2010/0264485 A1 | 10/2010 | Masuoka et al. |
| 2011/0220994 A1* | 9/2011 | Parekh ............. H01L 27/10882 257/334 |
| 2013/0140627 A1 | 6/2013 | Masuoka et al. |
| 2013/0153989 A1 | 6/2013 | Masuoka et al. |

FOREIGN PATENT DOCUMENTS

| | | |
|---|---|---|
| JP | 02-145761 | 6/1990 |
| JP | 02-188966 | 7/1990 |
| JP | 03-145761 | 6/1991 |
| JP | 06-021389 | 1/1994 |
| JP | 06-021467 | 1/1994 |
| JP | 07-245291 | 9/1995 |
| JP | 07-263677 | 10/1995 |
| JP | 08-227997 | 9/1996 |
| JP | 10-209407 | 8/1998 |
| JP | 10-256510 | 9/1998 |
| JP | 11-297984 | 10/1999 |
| JP | 2001-284598 | 10/2001 |
| JP | 2003-179160 | 6/2003 |
| JP | 2005-197704 | 7/2005 |
| JP | 2006-108514 | 4/2006 |
| JP | 2006-310651 | 11/2006 |
| JP | 2006-351745 | 12/2006 |
| JP | 2007-520883 | 7/2007 |
| JP | 2007-528609 | 10/2007 |
| JP | 2007-329480 | 12/2007 |
| JP | 2008-511997 | 4/2008 |
| JP | 2008-140996 A | 6/2008 |
| JP | 2008-177565 | 7/2008 |
| JP | 2009-081163 | 4/2009 |
| JP | 2009-182317 | 8/2009 |
| JP | 2010-251586 | 11/2010 |
| JP | 2010-251678 | 11/2010 |
| JP | 2010-258345 | 11/2010 |
| JP | 2010-272874 | 12/2010 |
| JP | 2011-086900 | 4/2011 |
| JP | 2011-187927 | 9/2011 |
| JP | 2011-258780 | 12/2011 |
| JP | 2012-004244 | 1/2012 |
| WO | WO 2005/079182 | 9/2005 |
| WO | WO 2006/028777 | 3/2006 |

OTHER PUBLICATIONS

International Search Report for PCT/JP2012/062857 (including English Translation), dated Aug. 21, 2012, 3 pages.

Office Action for U.S. Appl. No. 13/289,742, dated Dec. 5, 2012, 13 pages.

Search Report and Written Opinion for Singapore Patent Application Serial No. 201108125-4, dated Oct. 5, 2012, 12 pages.

Extended European Search Report for European Application No. 10003947.8, dated Nov. 17, 2010, 9 pages.

Mistry et al., "A 45nm Logic Technology with High-k+Metal Gate Transistors, Strained Silicon, 9 Cu Interconnect Layers, 193nm Dry Patterning, and 100% Pb-free Packaging", *IEEE*, pp. 247-250, 2007.

Office Action from counterpart Chinese Application No. 201010167317.6, dated Nov. 24, 2011, 12 pages.

Wu et al., "High Performance 22/20nm FinFET CMOS Devices with Advanced High-K/Metal Gate Scheme", *IEEE*, pp. 27.1.1-27.1.4, 2010.

Office Action for U.S. Appl. No. 14/061,082 dated Jan. 13, 2014, 6 pages.

Notice of Allowance for U.S. Appl. No. 13/666,445 dated Apr. 9, 2014, 9 pages.

Office Action in corresponding U.S. Appl. No. 14/061,082 dated May 14, 2014, 9 pages.

Office Action for U.S. Appl. No. 14/061,082 dated May 6, 2015, 9 pages.

Office Action for U.S. Appl. No. 14/061,082 dated Oct. 22, 2015, 10 pages.

Office Action in corresponding U.S. Appl. No. 14/061,082 dated Mar. 24, 2016, 11 pages.

Notice of Allowance in corresponding U.S. Appl. No. 14/061,082 dated Jun. 22, 2016, 7 pages.

Office Action, and English language translation thereof, in corresponding Japanese Application No. 2016-140428, dated Jul. 24, 2017, 6 pages.

* cited by examiner

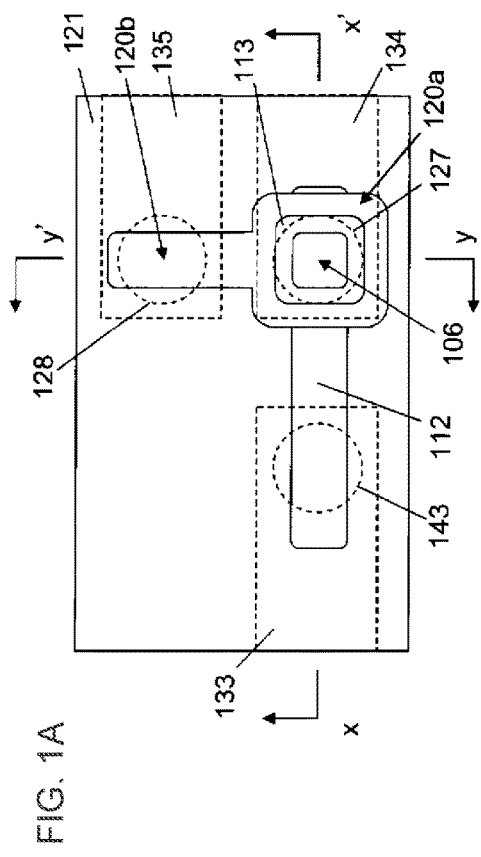
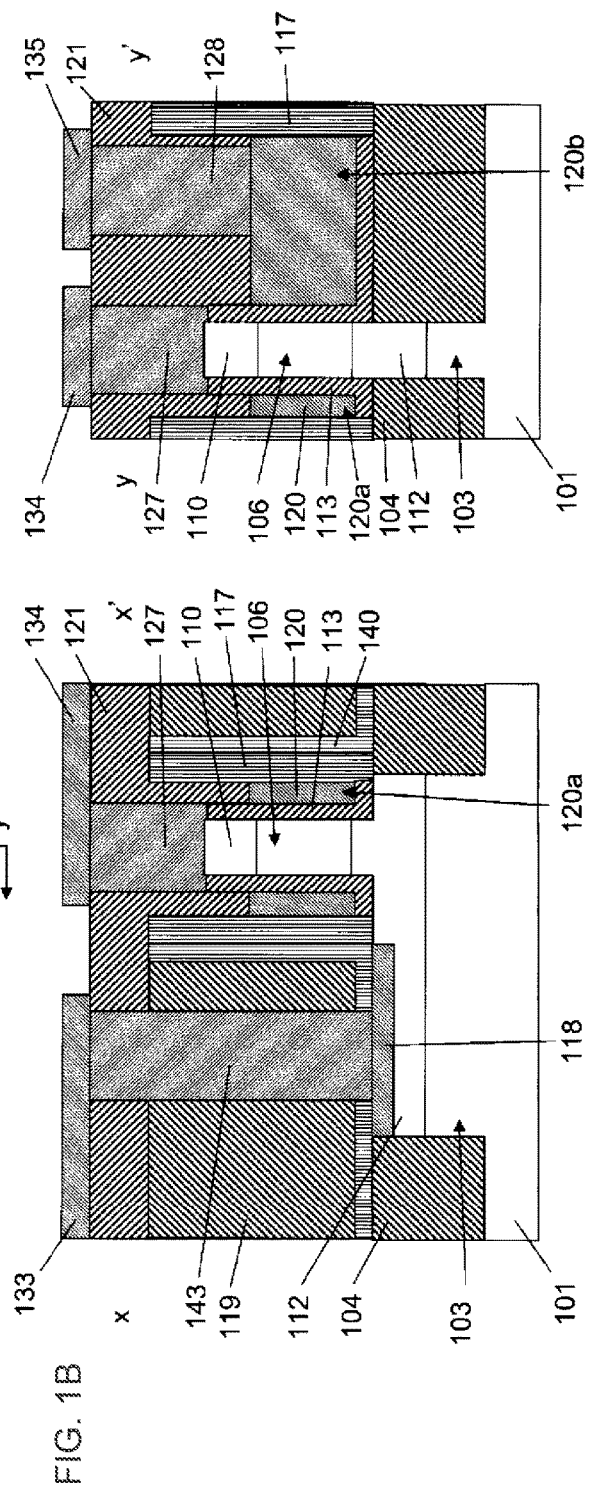
FIG. 1A
FIG. 1B
FIG. 1C

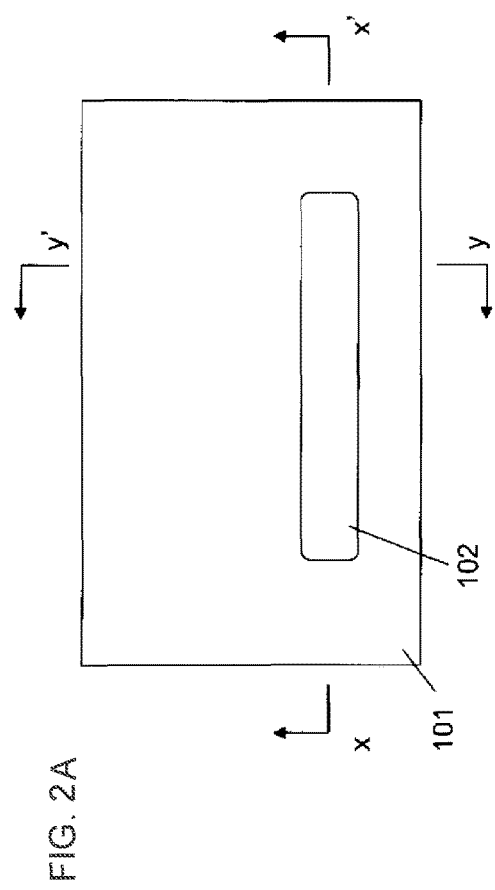
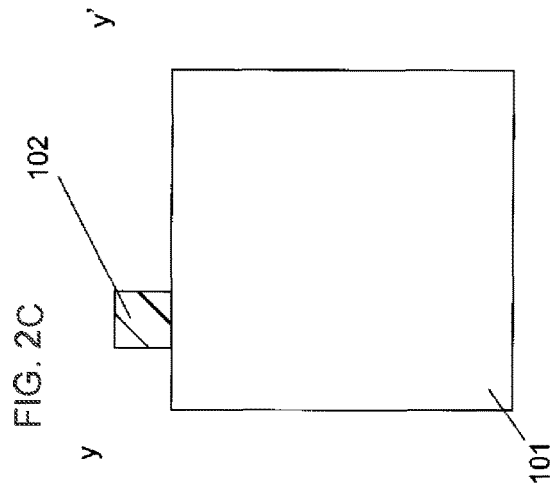
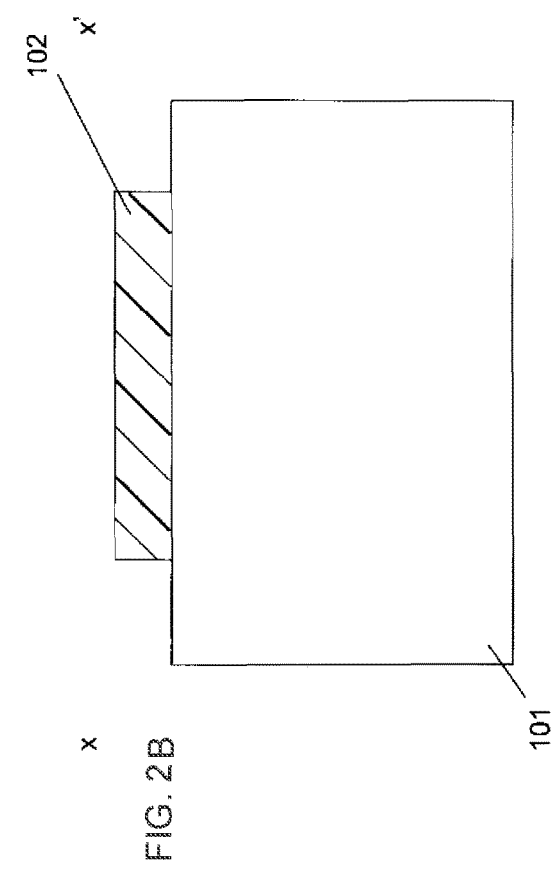

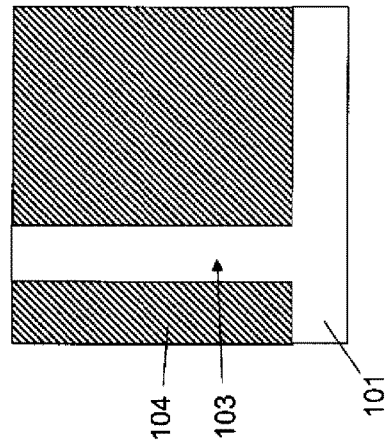
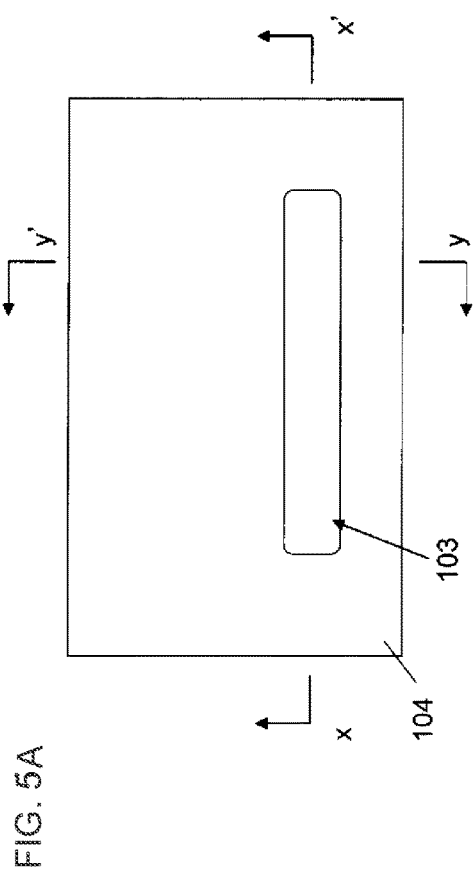
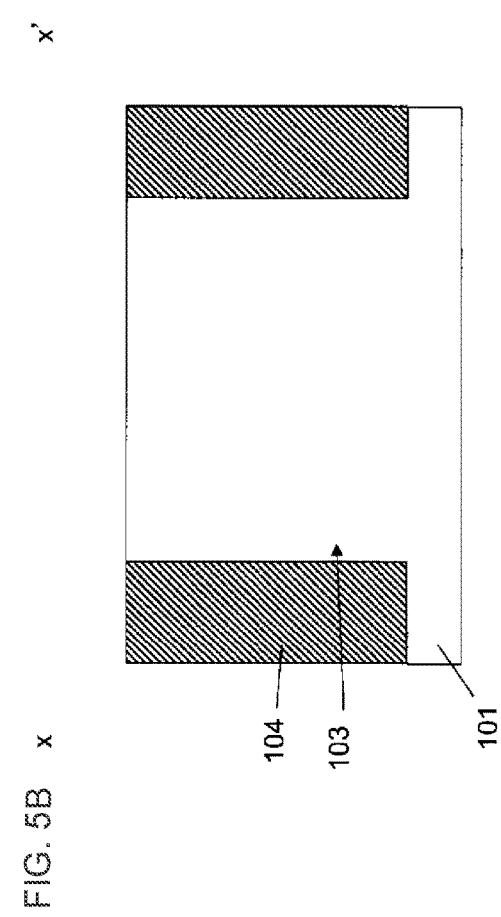

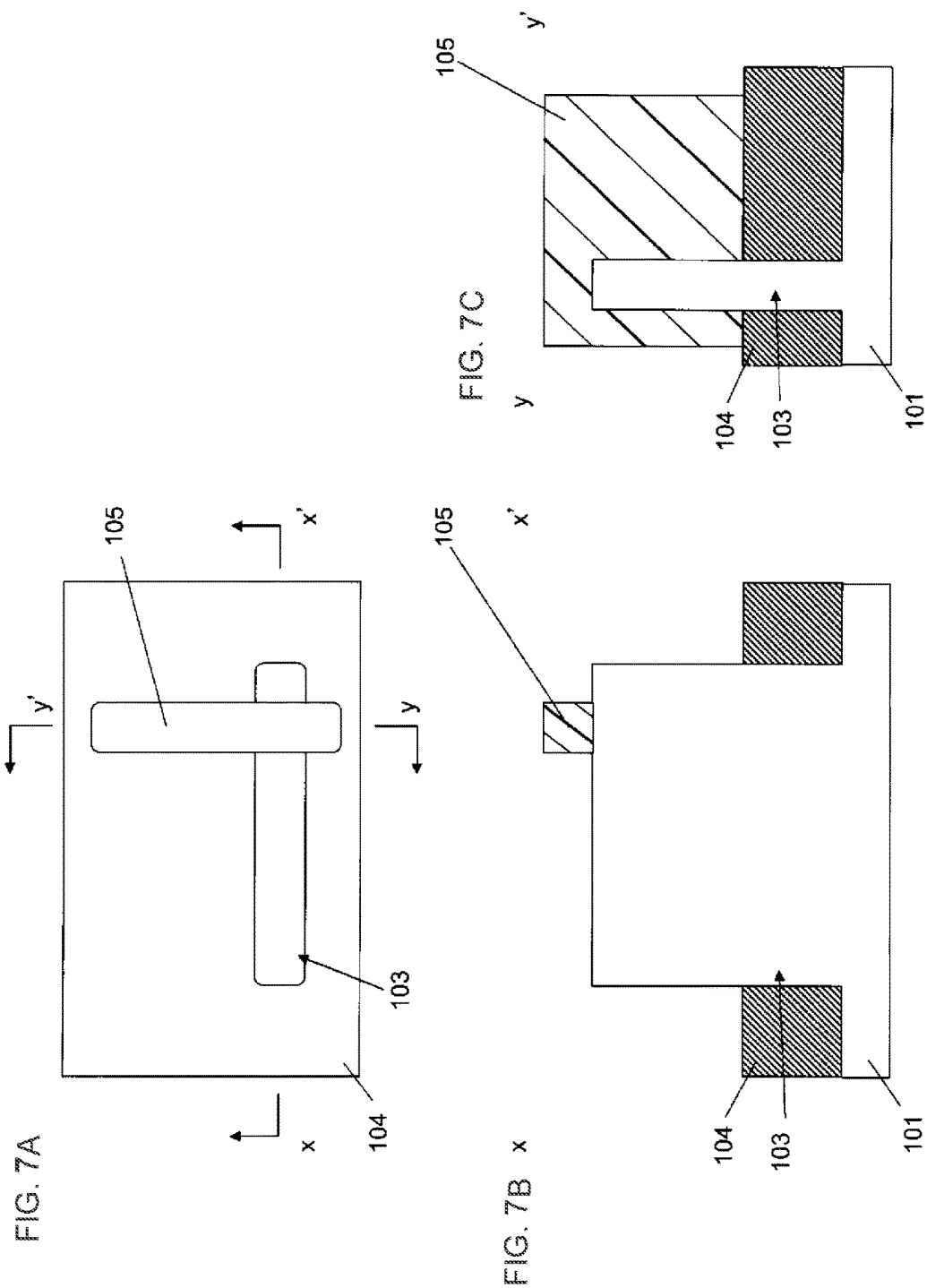

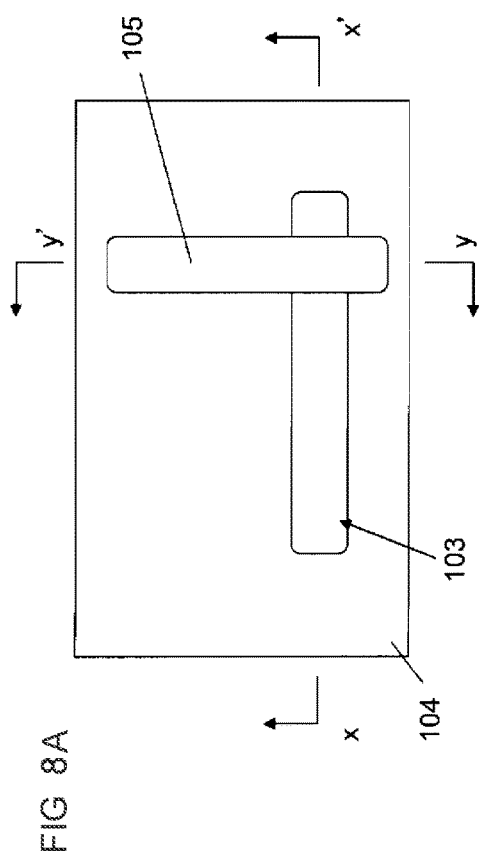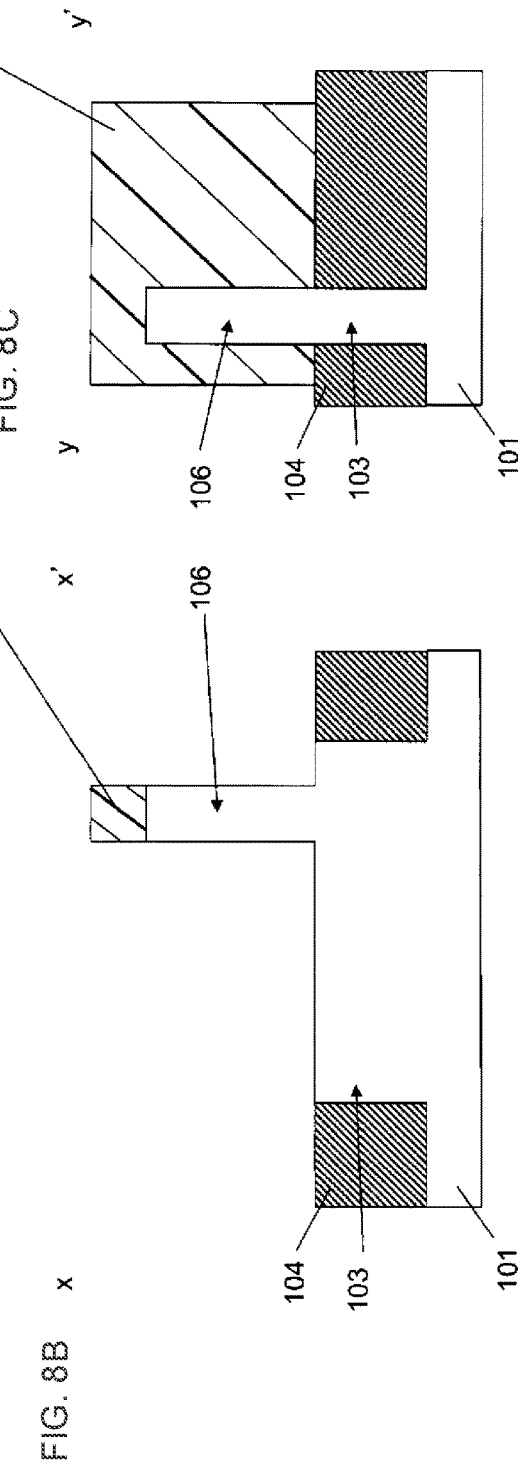

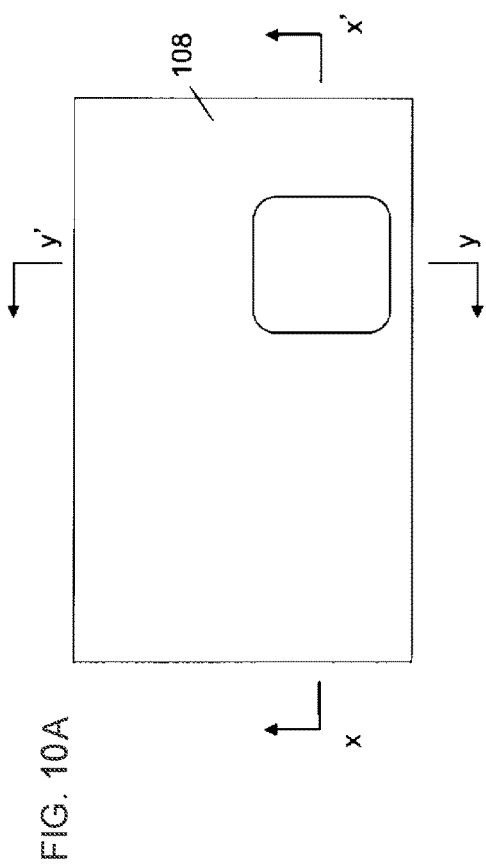
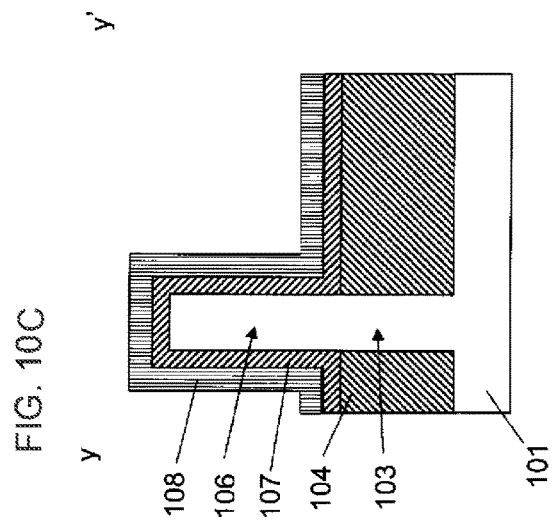
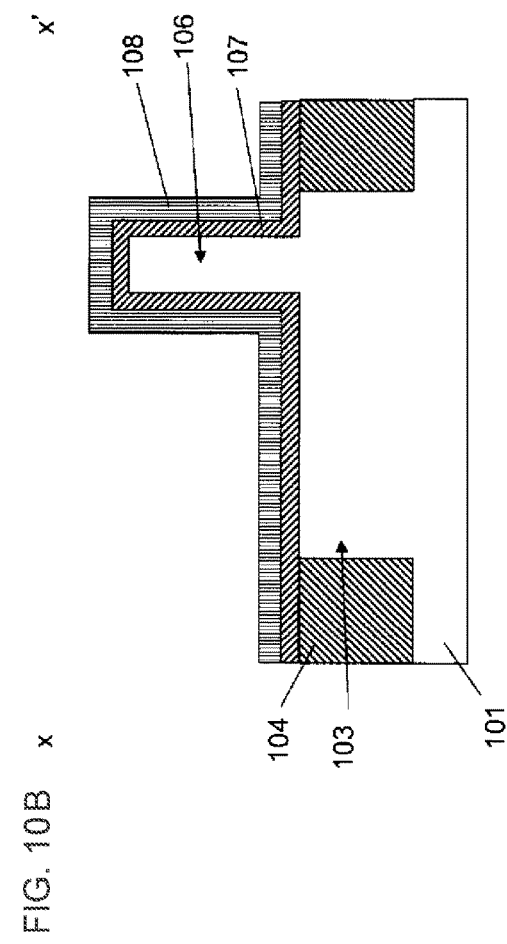

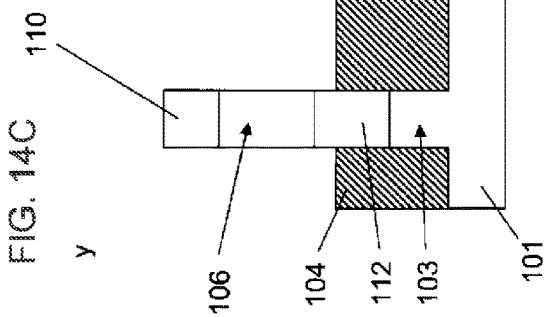
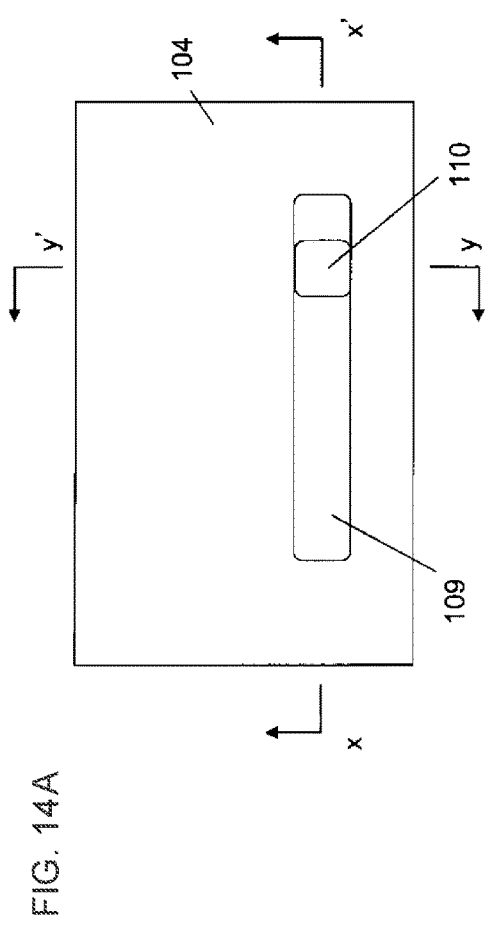
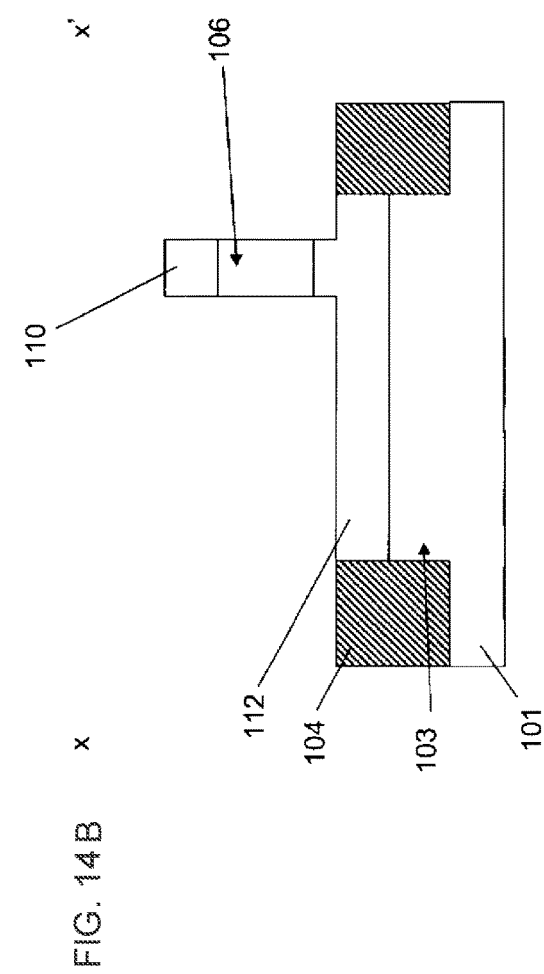

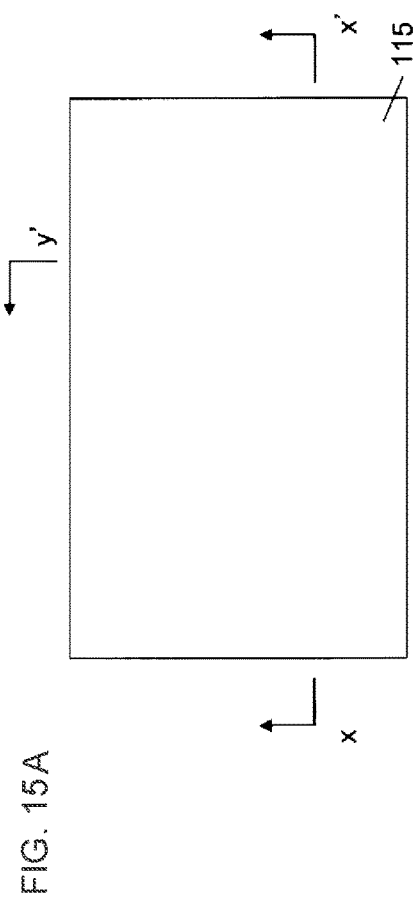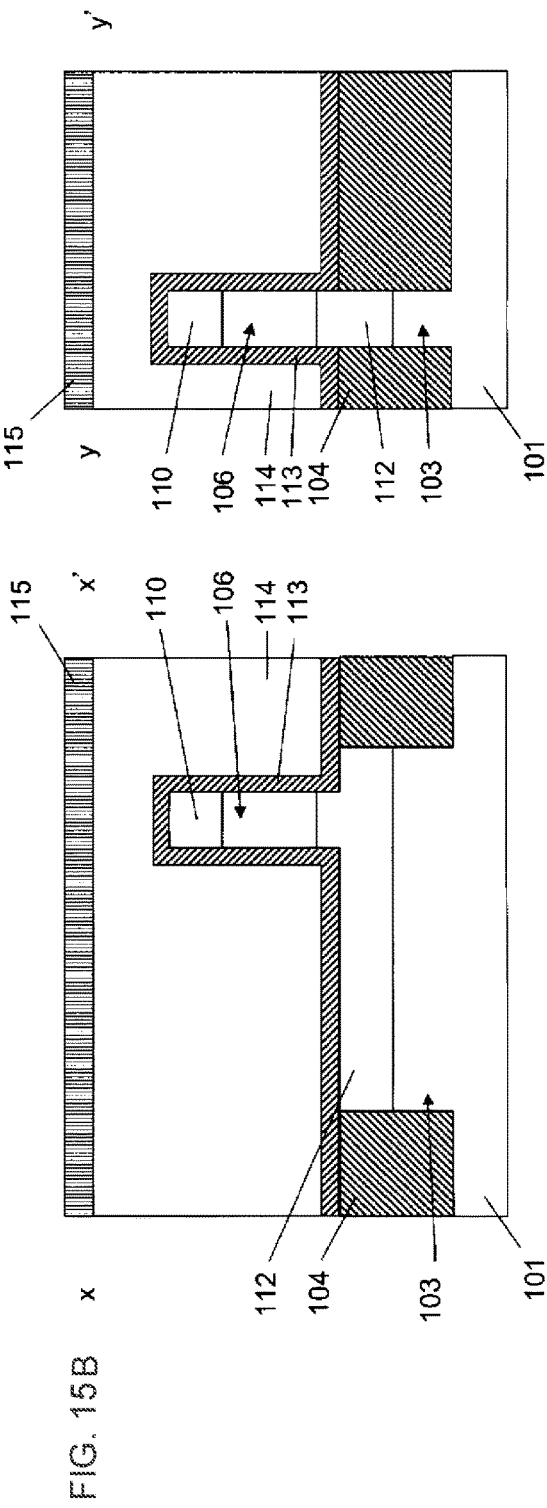

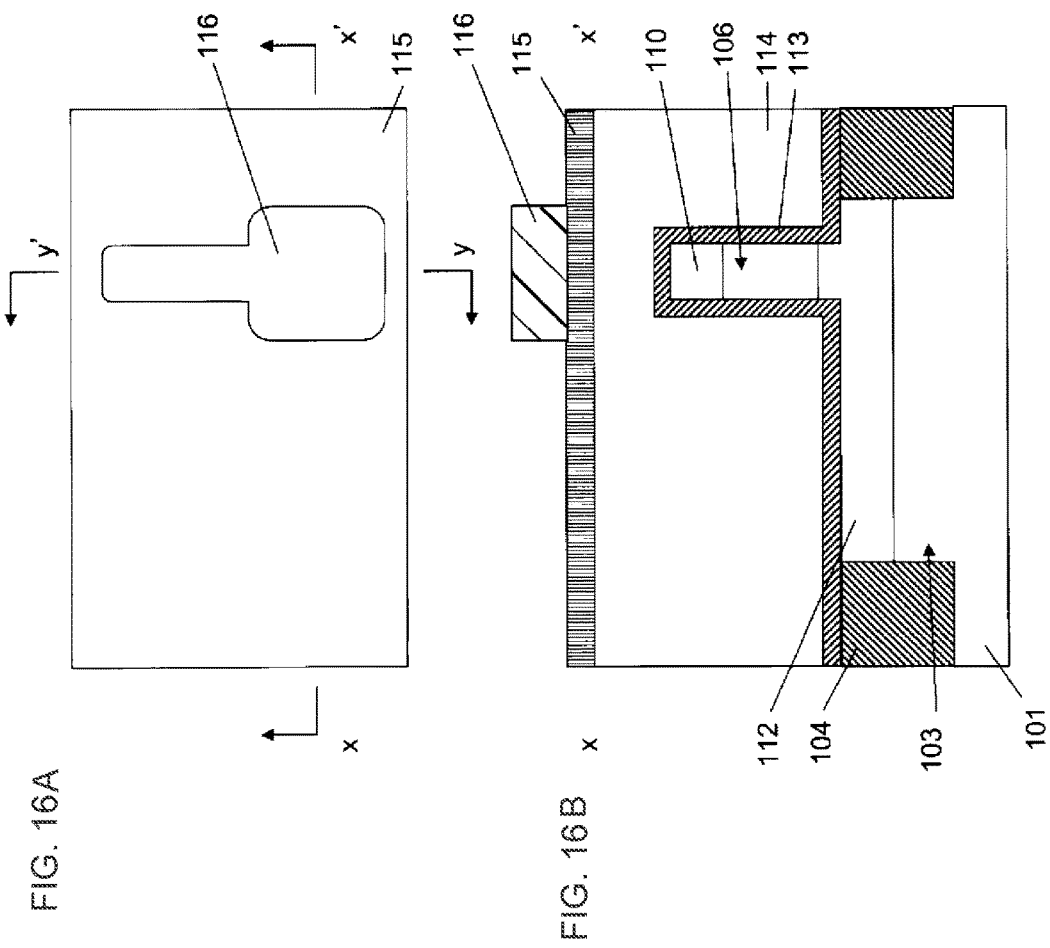

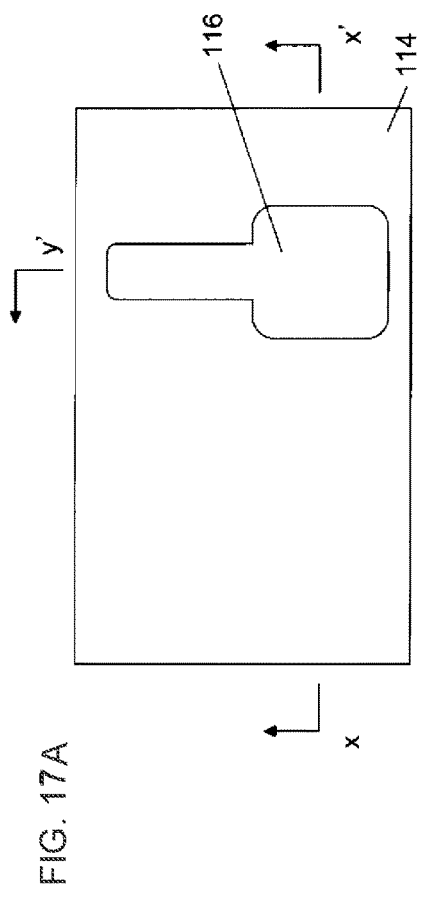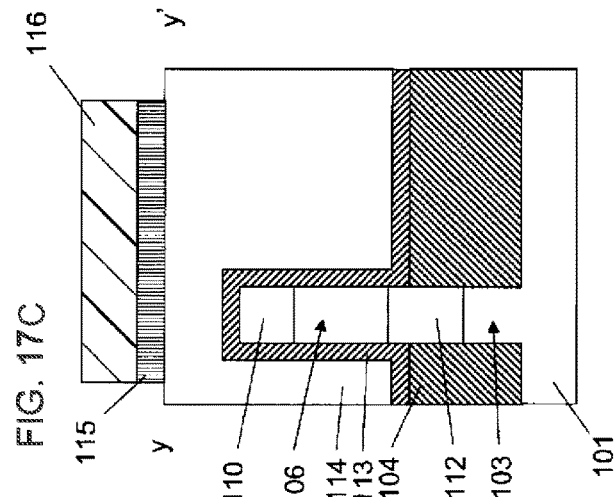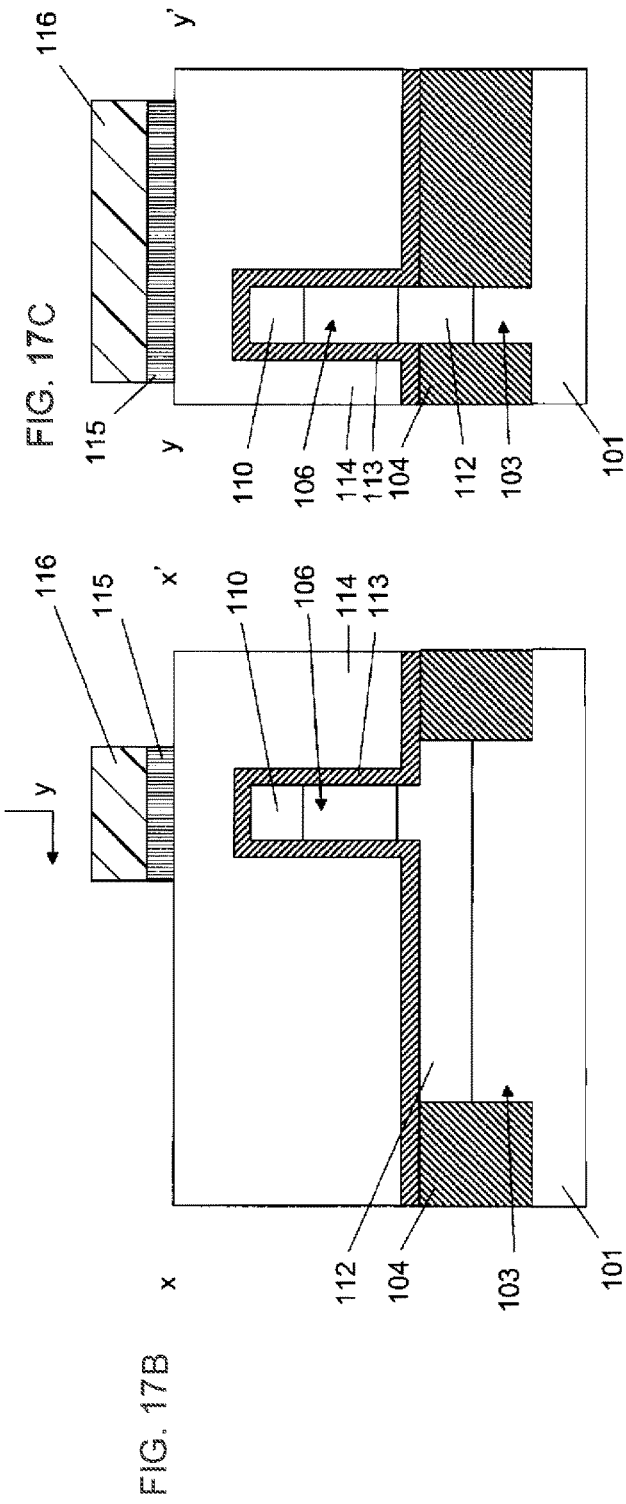

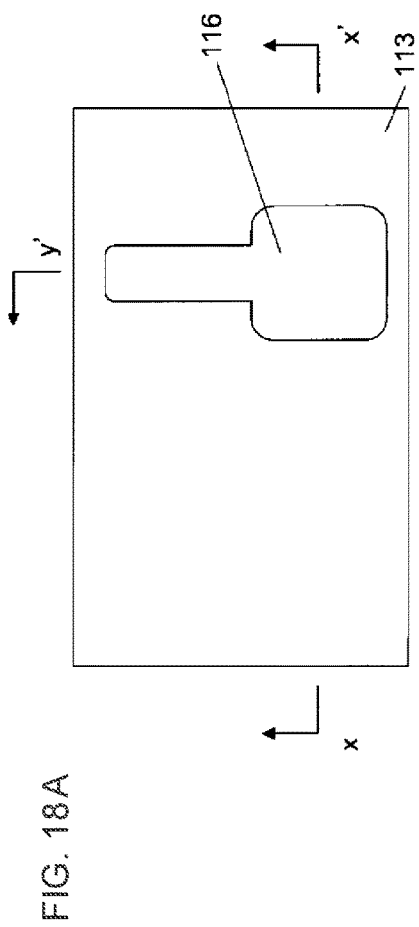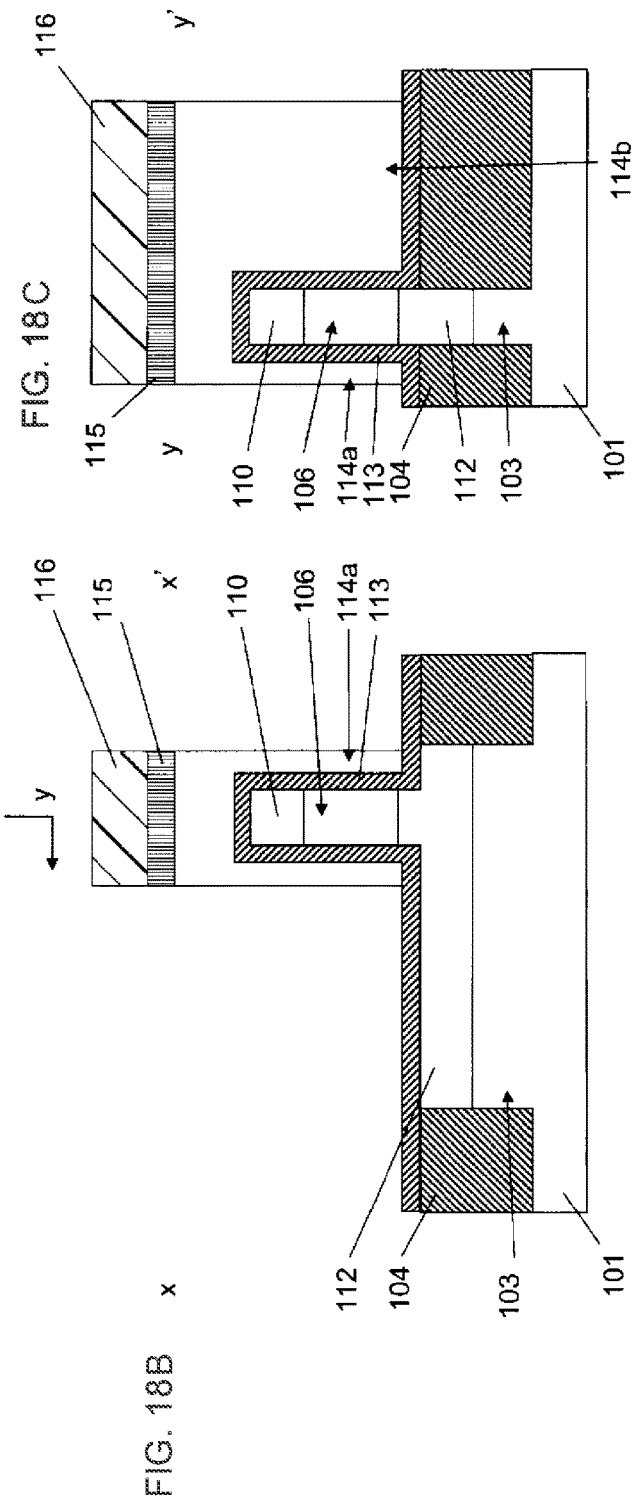

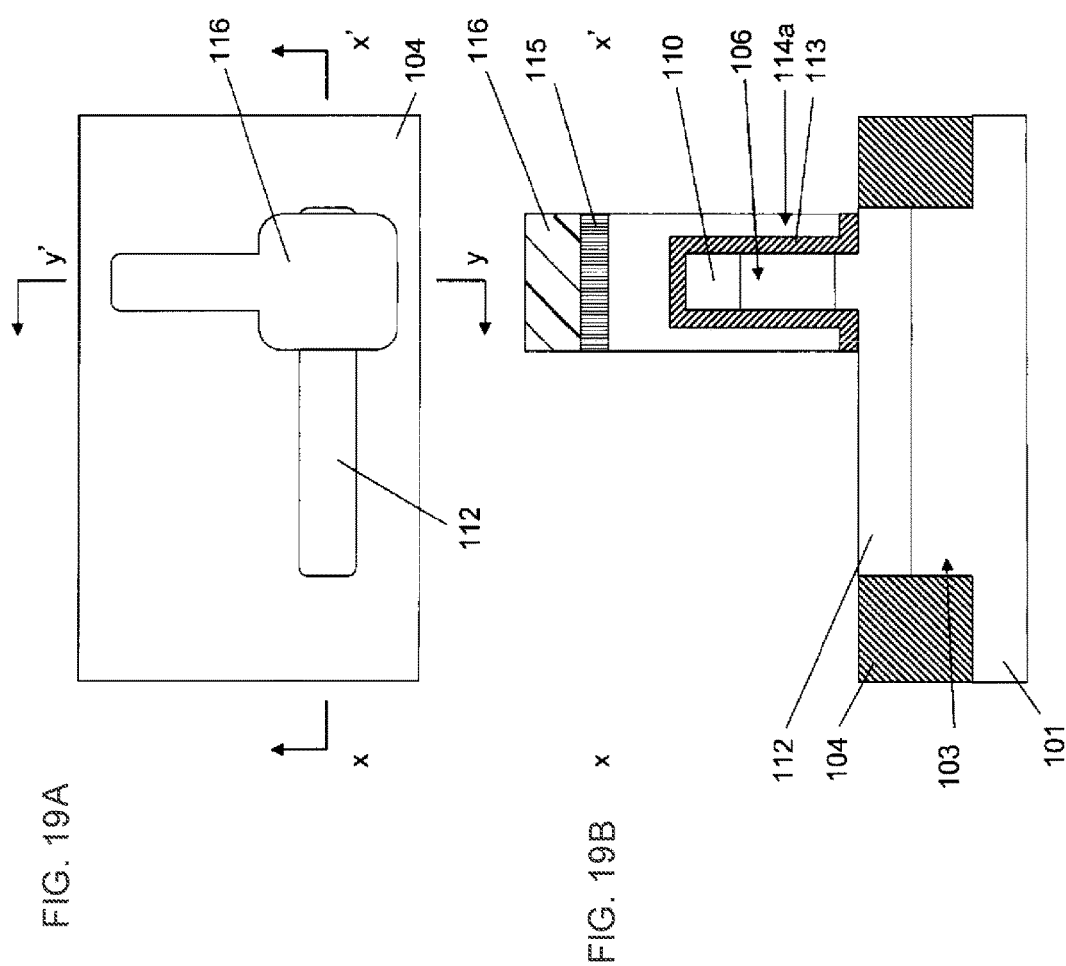

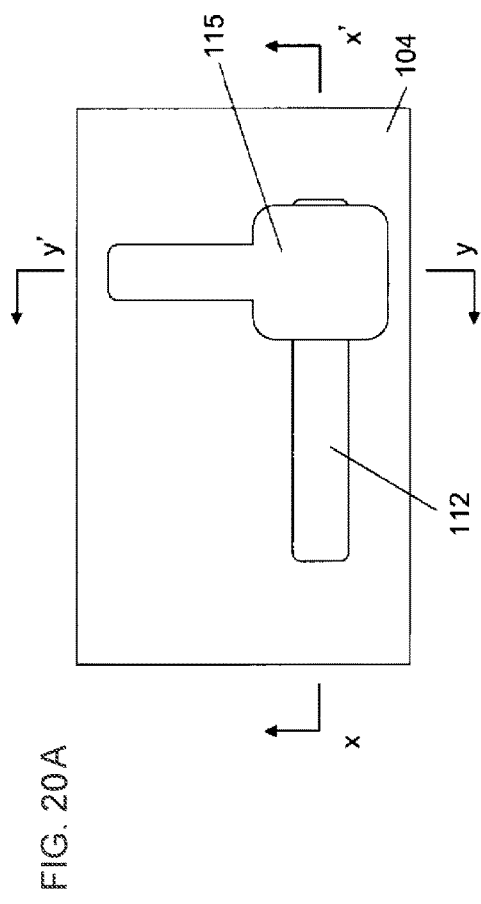
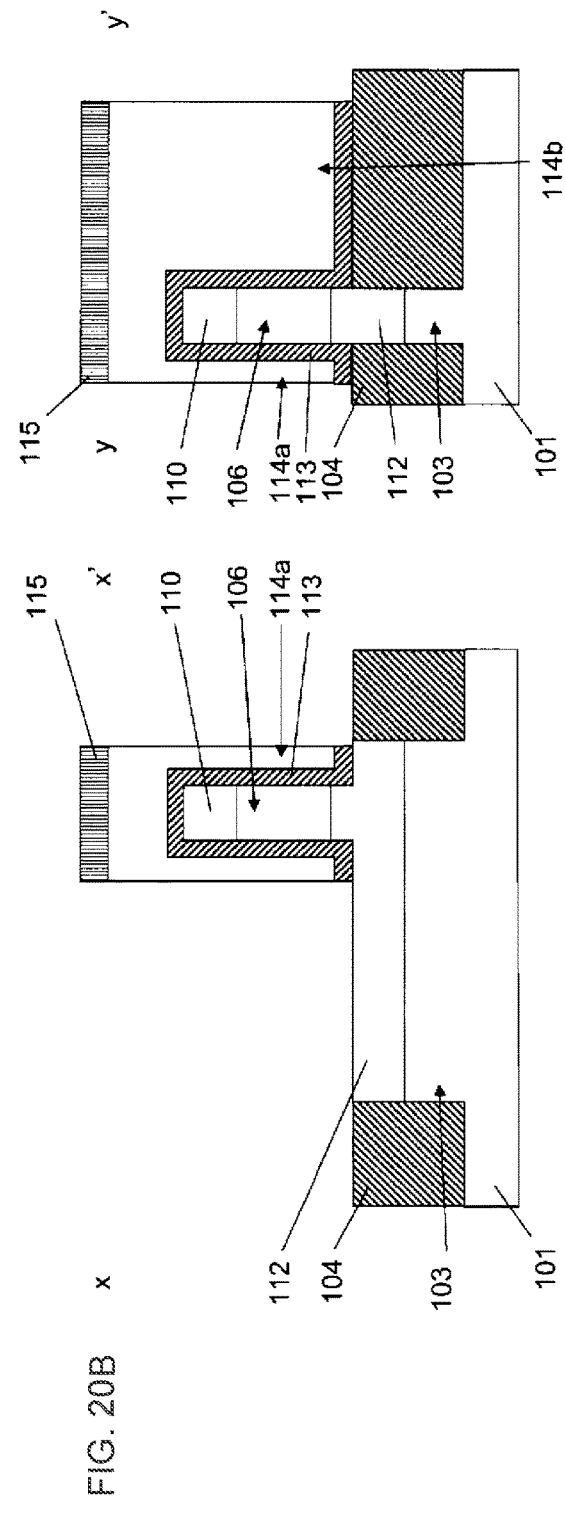
FIG. 20A
FIG. 20B
FIG. 20C

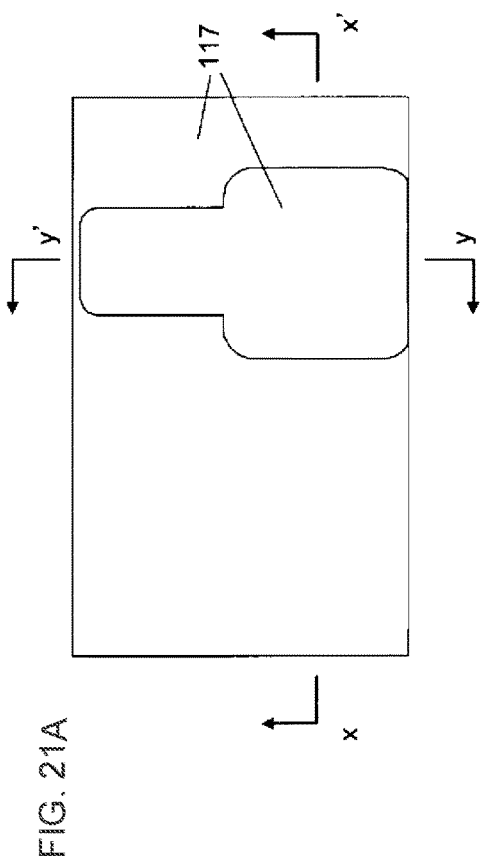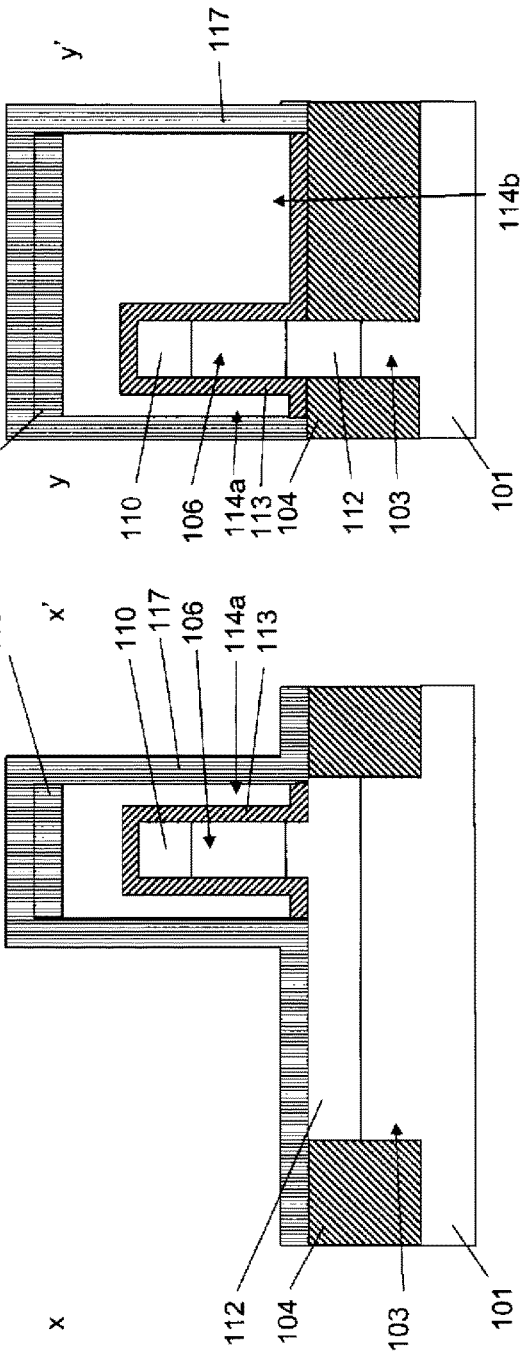
FIG. 21A
FIG. 21B
FIG. 21C

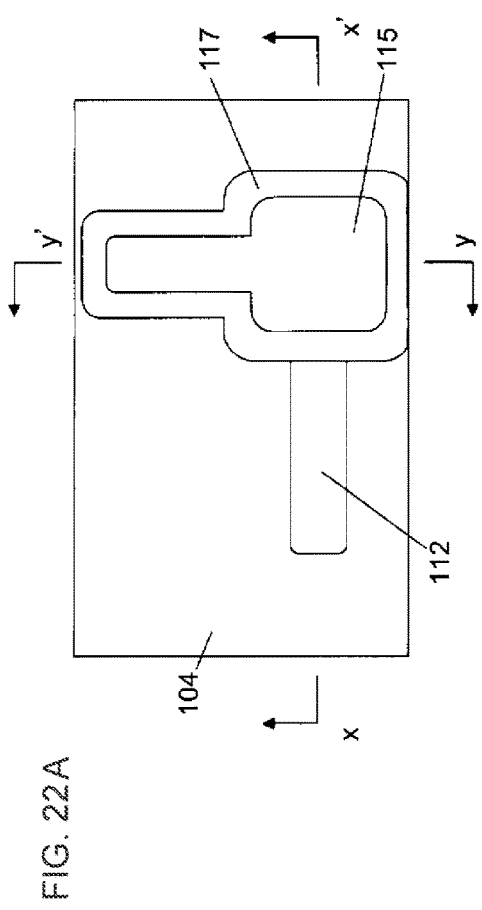
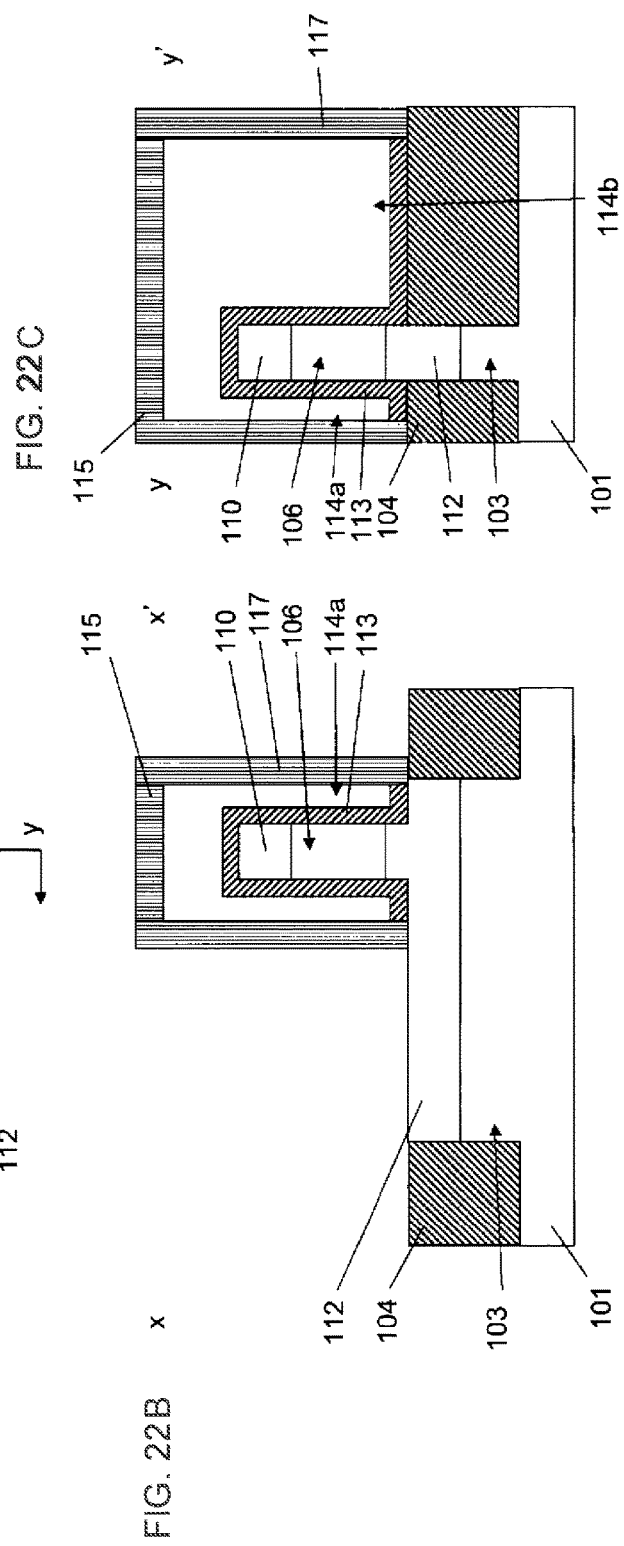
FIG. 22A
FIG. 22B
FIG. 22C

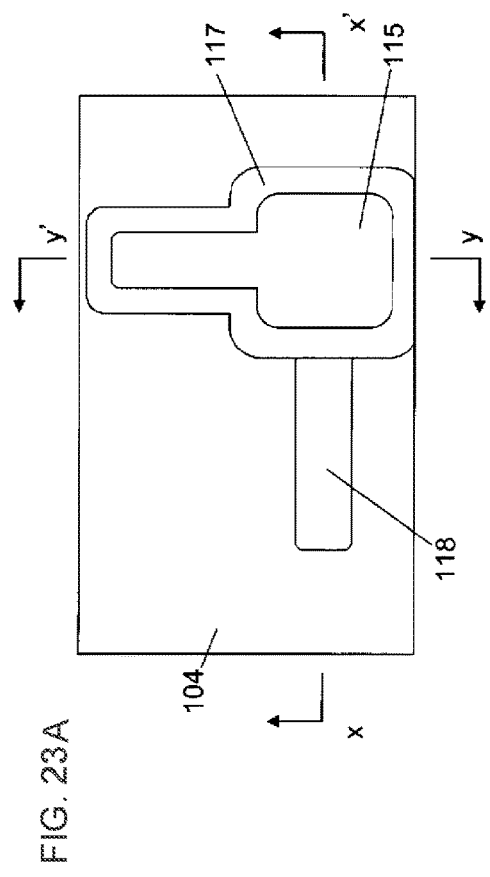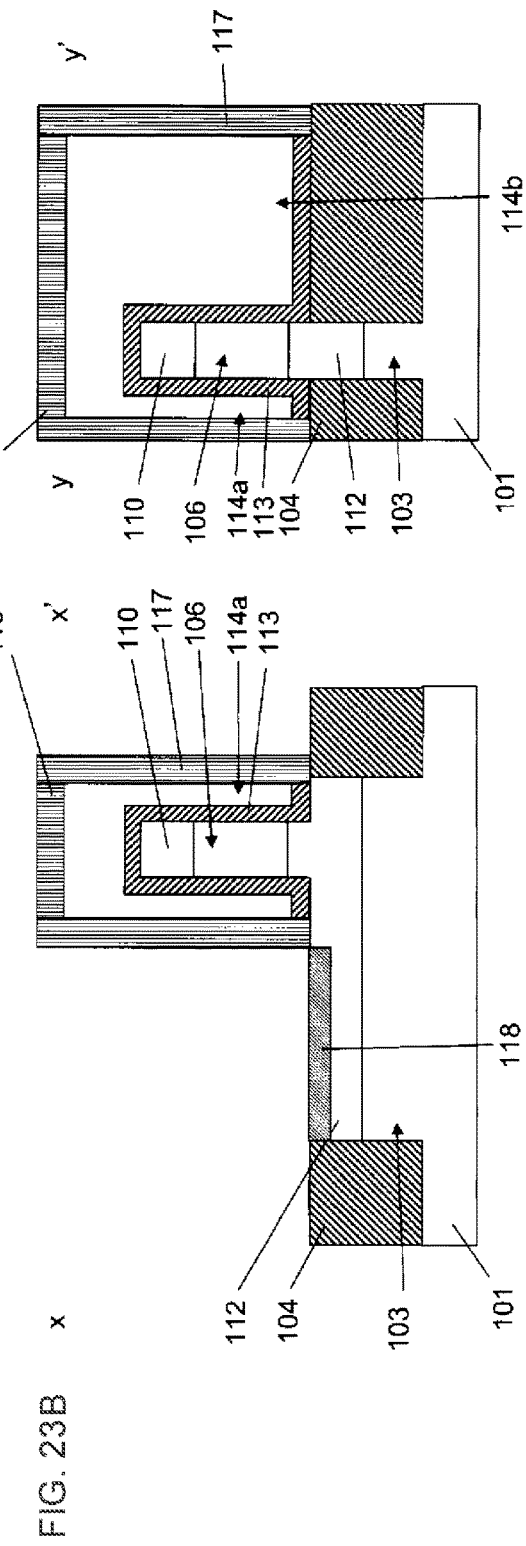

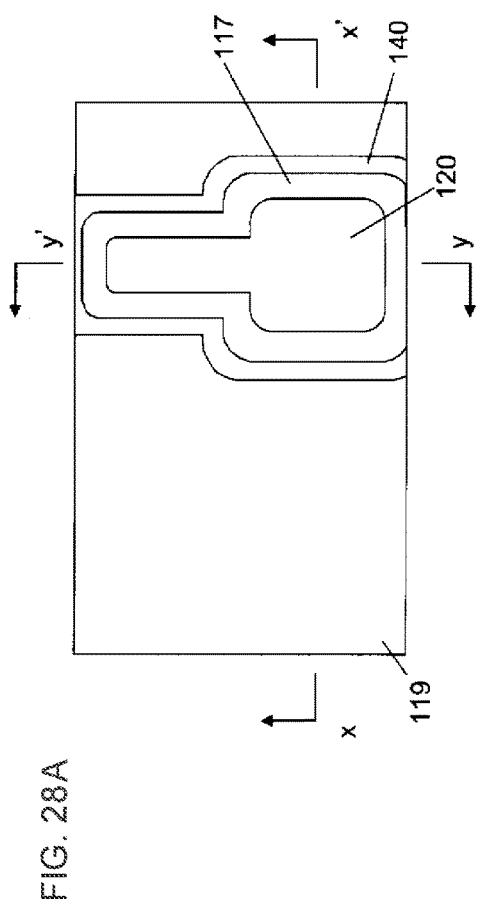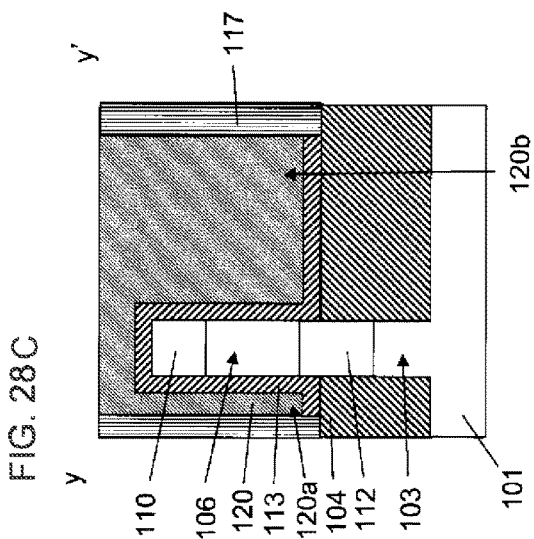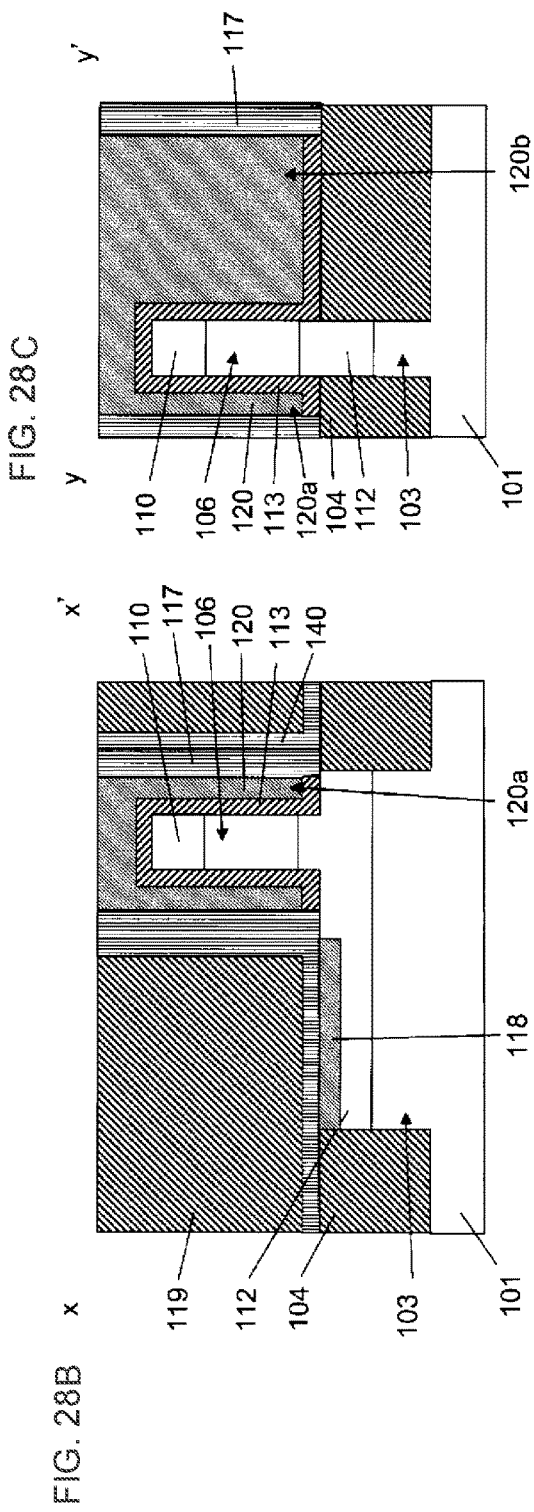
FIG. 28A
FIG. 28B
FIG. 28C

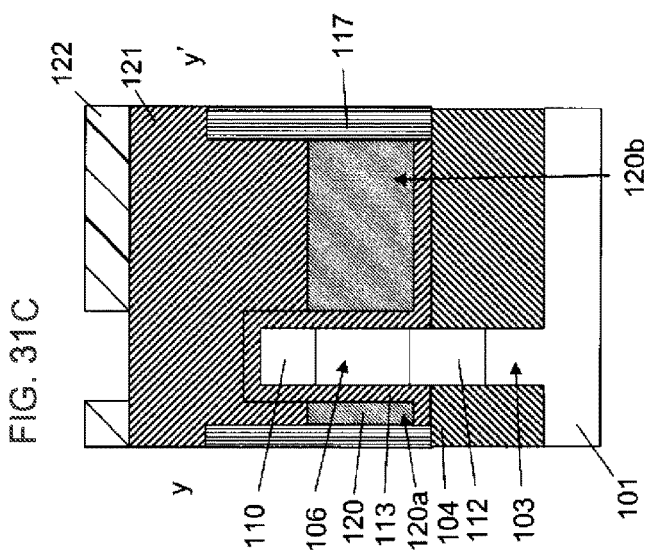
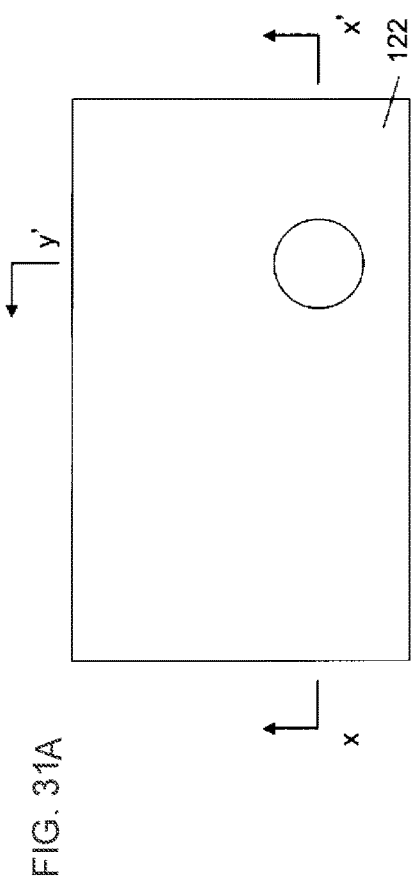
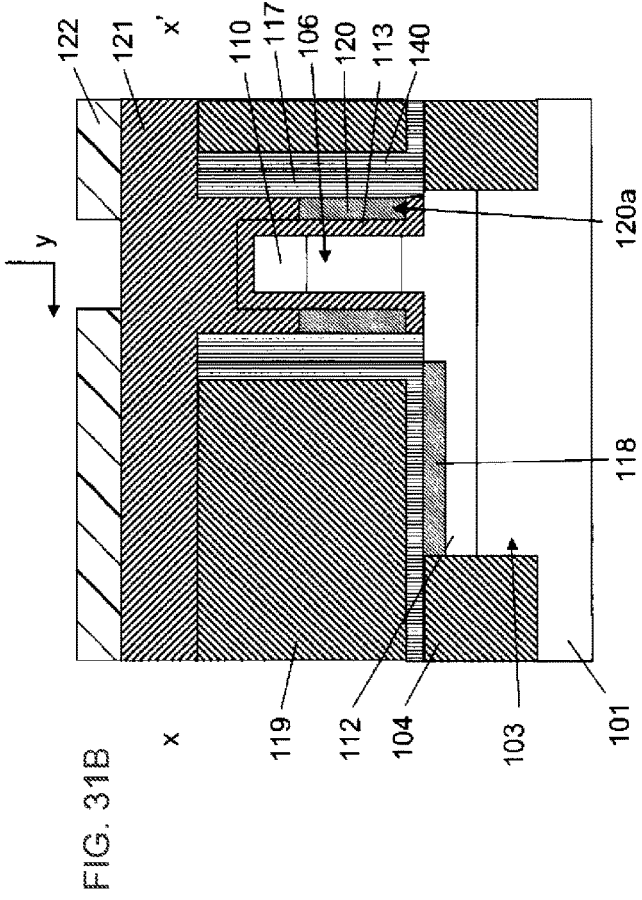

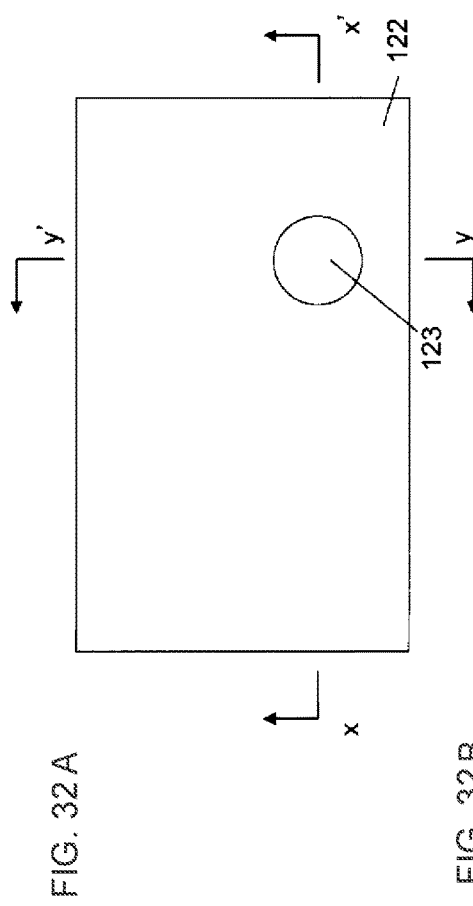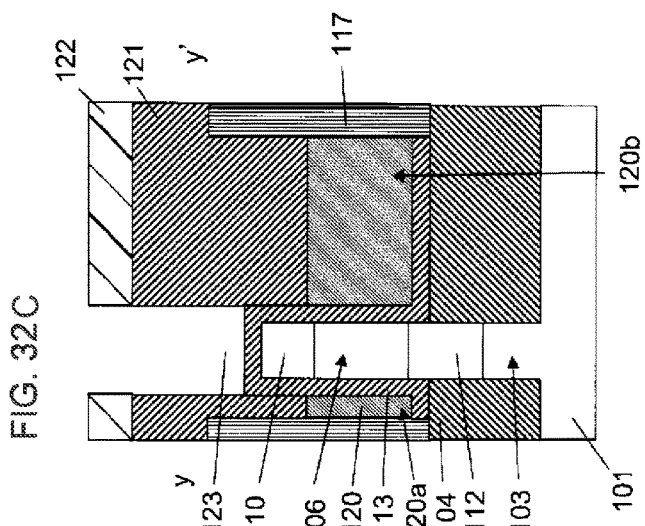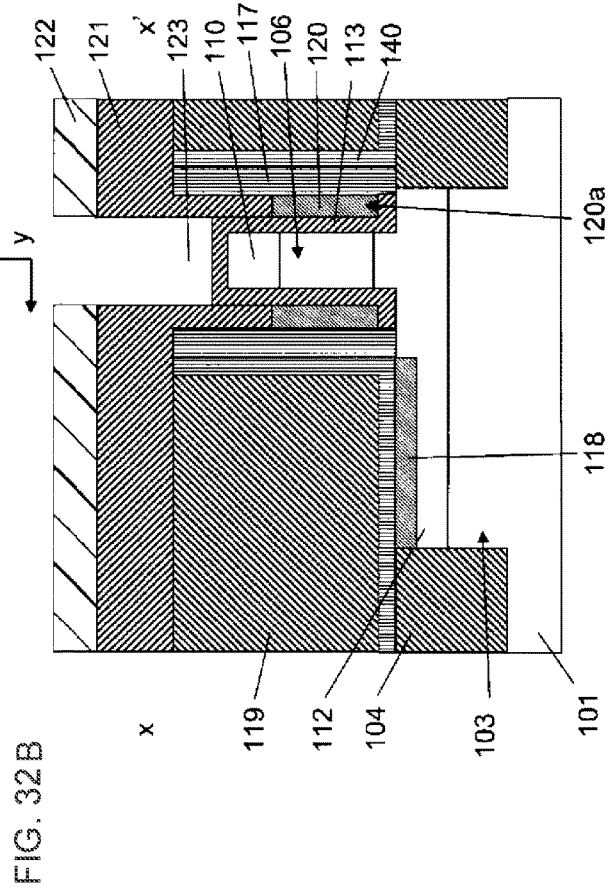
FIG. 32A
FIG. 32B
FIG. 32C

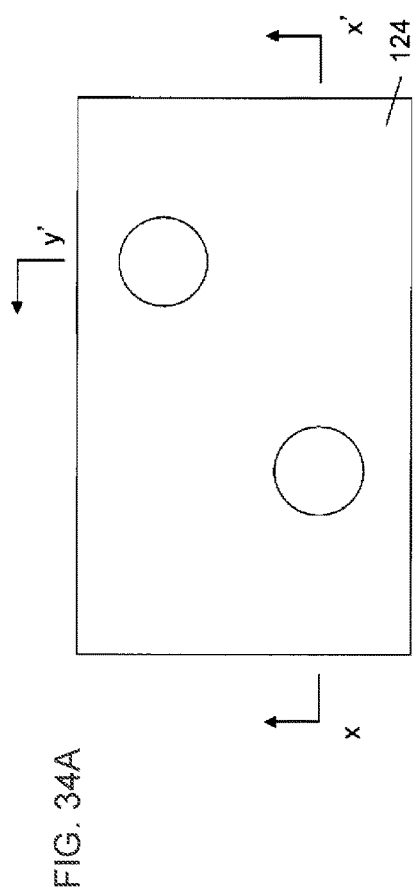
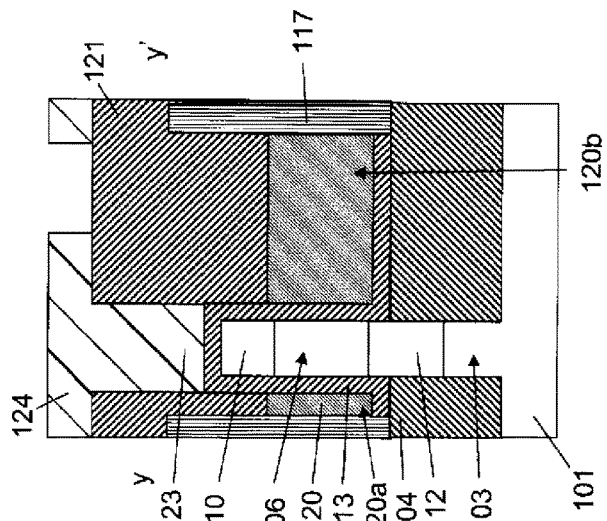
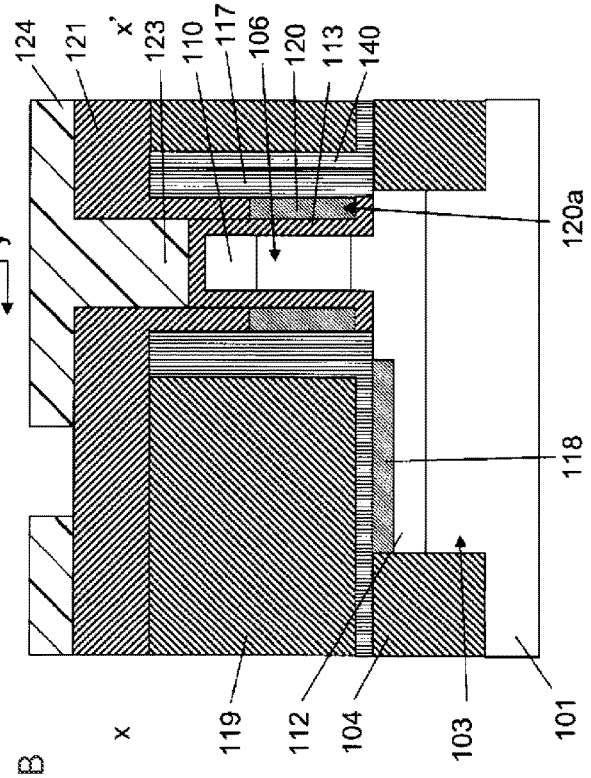

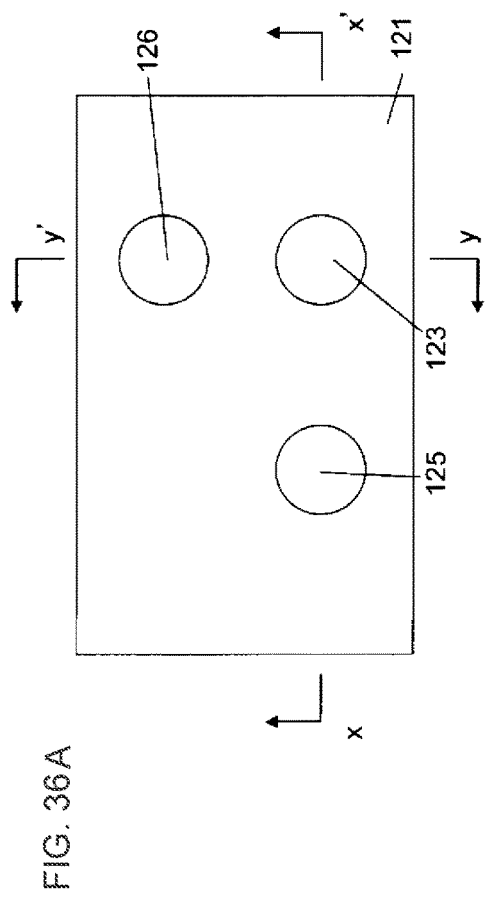
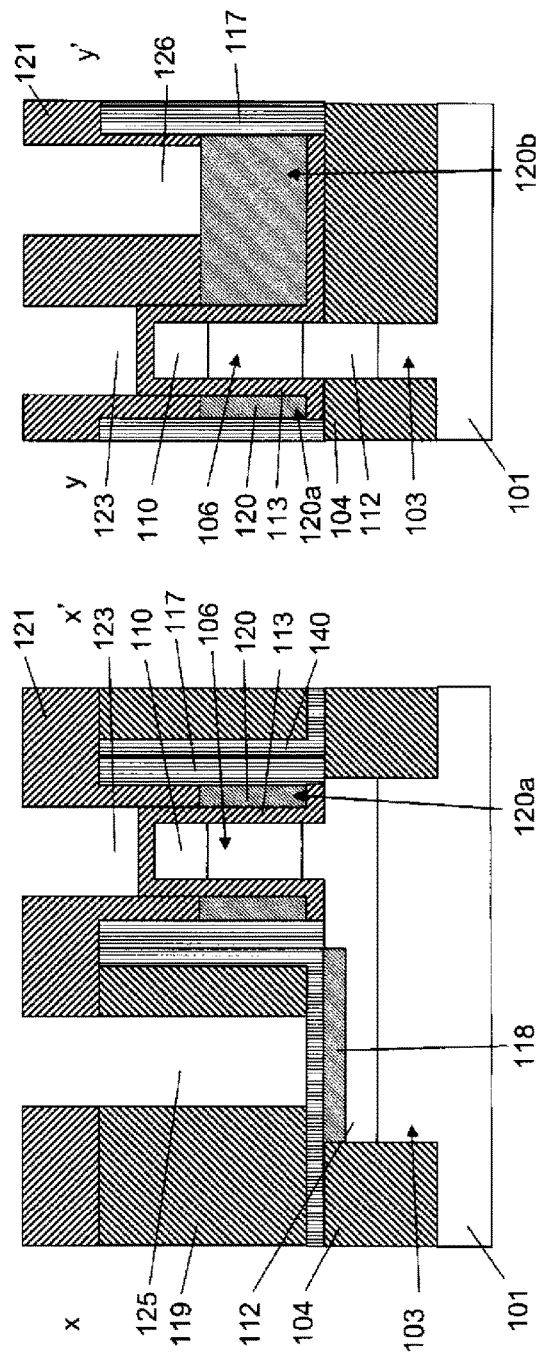
FIG. 36A
FIG. 36B
FIG. 36C

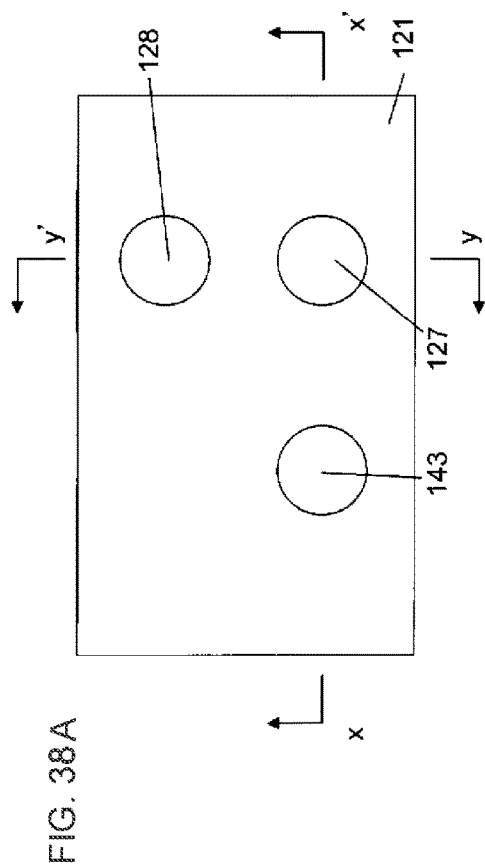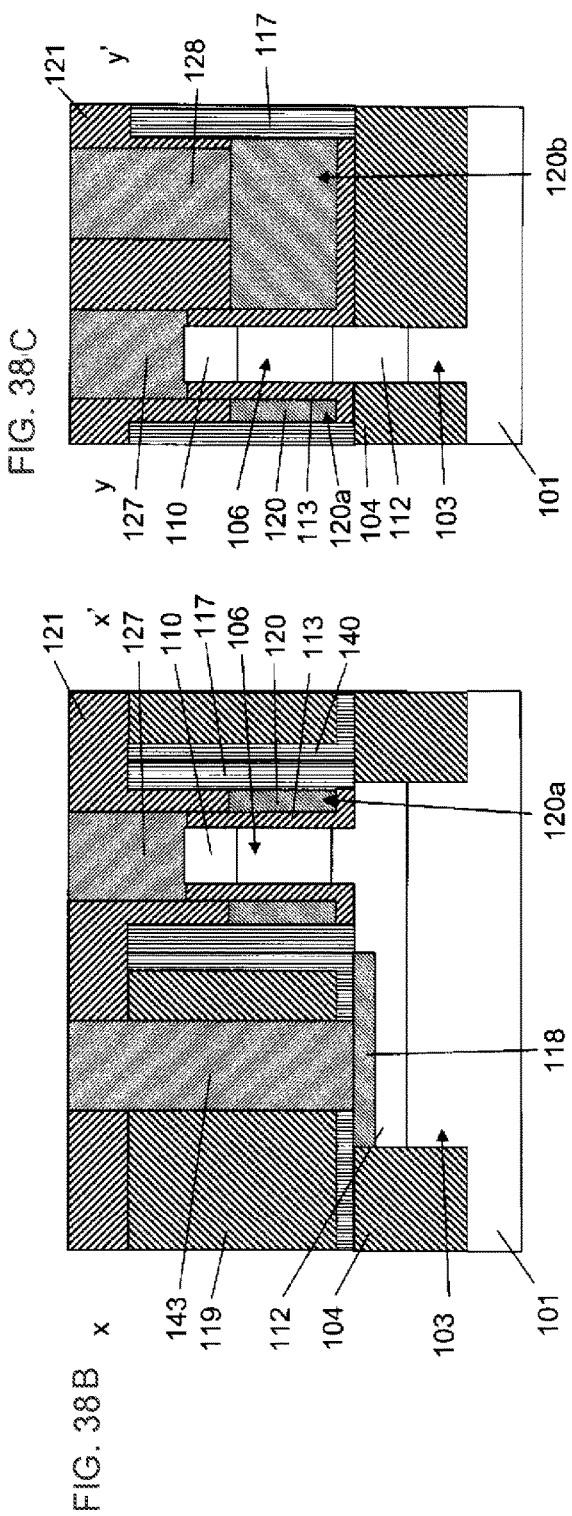
FIG. 38A
FIG. 38B
FIG. 38C

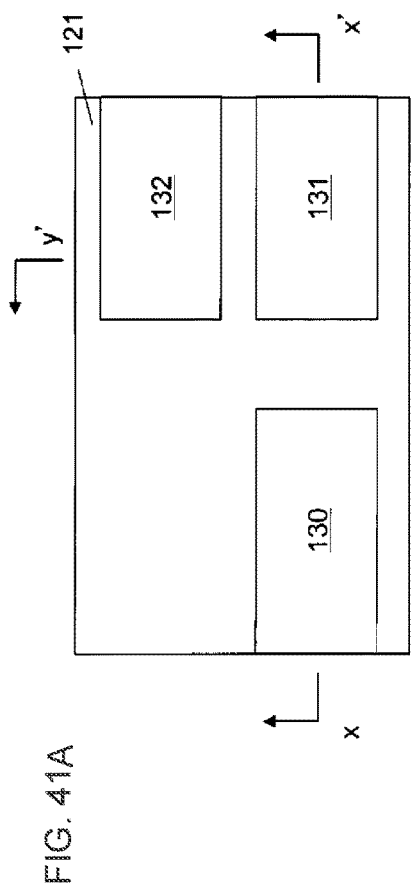
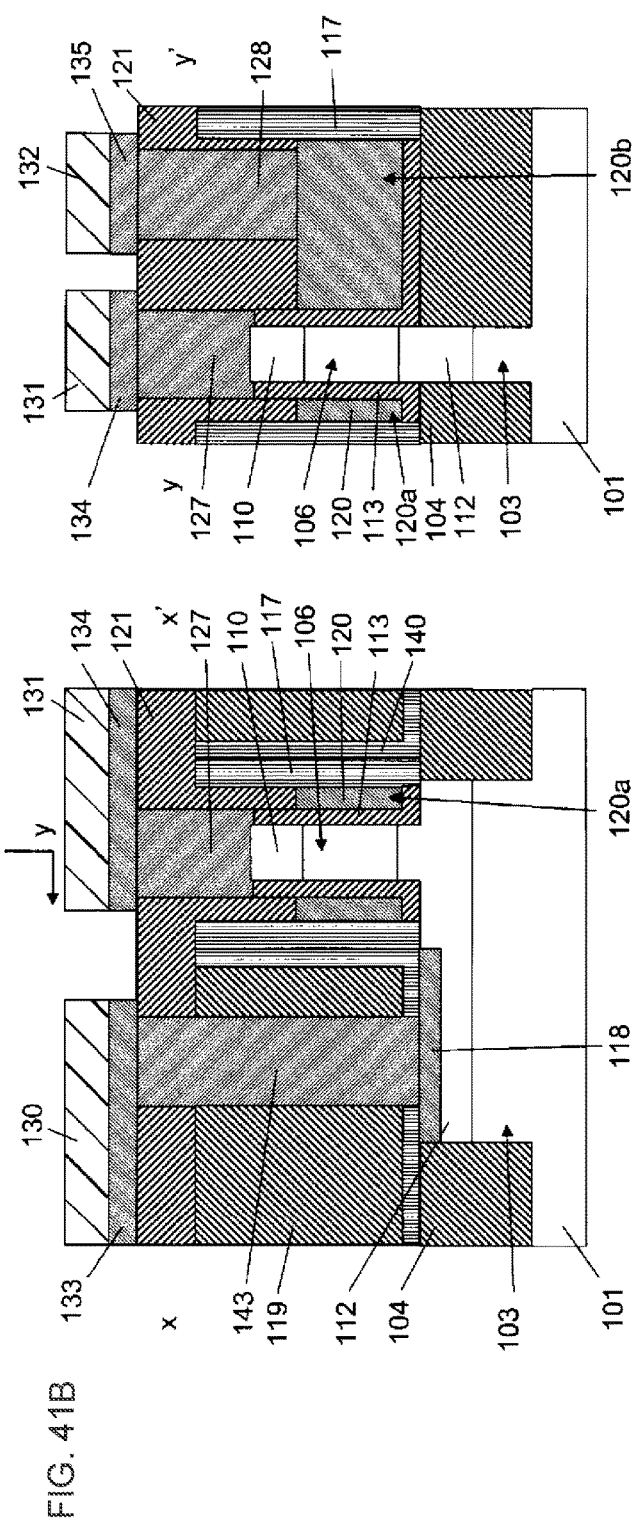
FIG. 41A
FIG. 41B
FIG. 41C

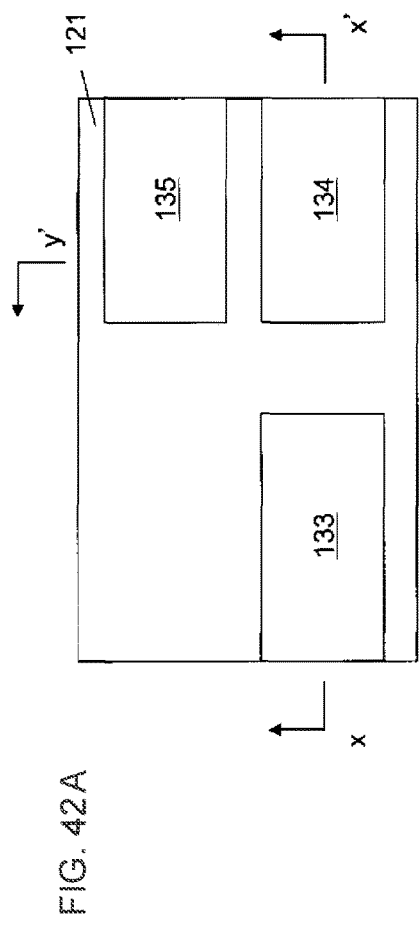
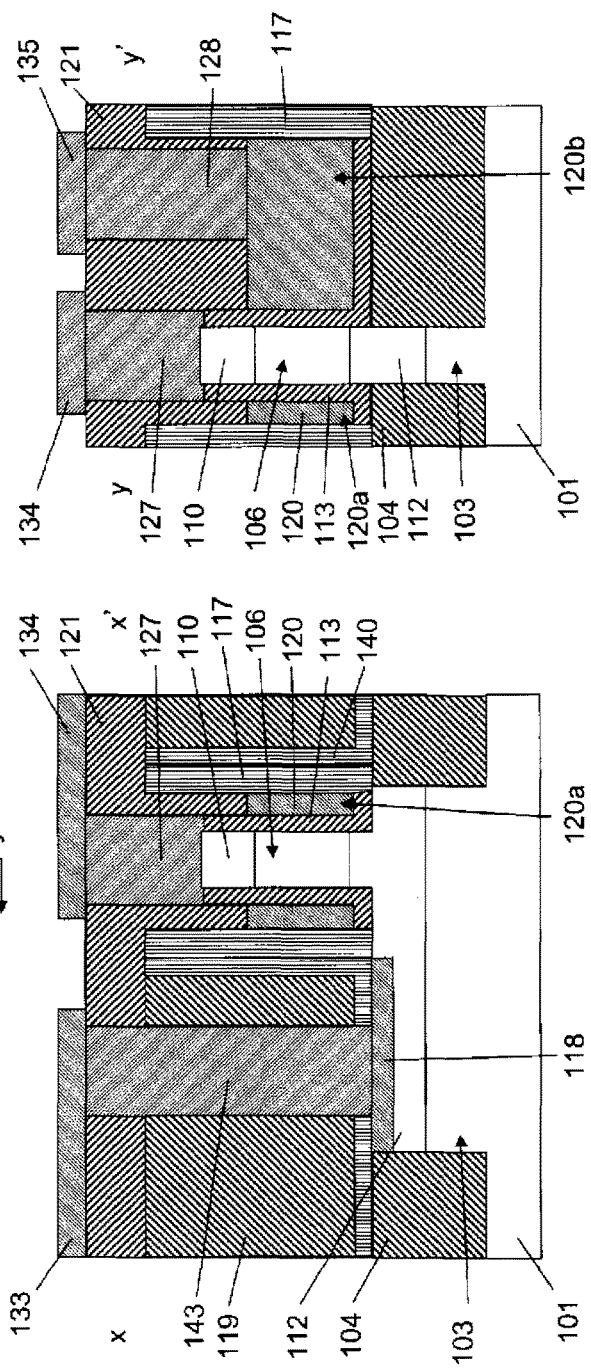
FIG. 42A
FIG. 42B
FIG. 42C

METHOD FOR MANUFACTURING A SEMICONDUCTOR DEVICE

RELATED APPLICATIONS

This application is a continuation-in-part application of U.S. application Ser. No. 14/272,944, filed May 8, 2014, which is a continuation application of U.S. application Ser. No. 13/666,445, filed Nov. 1, 2012, now U.S. Pat. No. 8,759,178, which claims the benefit of the filing date of Provisional U.S. Patent Application Ser. No. 61/557,501 filed on Nov. 9, 2011. The entire contents of which are hereby incorporated by reference.

BACKGROUND

1. Technical Field

The present invention relates to a method for manufacturing a semiconductor device and to a semiconductor device.

2. Description of the Related Art

Semiconductor integrated circuits, particularly integrated circuits using MOS transistors, are increasing in integration. With increases in integration, MOS transistors used in the integrated circuits are increasingly made finer up to a nano region. Finer MOS transistors have the problem of difficulty in suppressing leak currents and difficulty in decreasing the areas occupied by circuits because of the demand for securing necessary amounts of currents. In order to resolve the problem, there have been proposed surrounding gate transistors (SGT) having a structure in which a source, a gate, and a drain are disposed in a direction vertical to a substrate, and the gate surrounds a pillar-shaped semiconductor layer (for example, Japanese Unexamined Patent Application Publication Nos. 2-71556, 2-188966, and 3-145761).

By using a metal for a gate electrode instead of using polysilicon, depletion can be suppressed, and the resistance of the gate electrode can be decreased. However, a manufacturing process after a metal gate is formed must be one in which metal contamination by the metal gate is always taken into consideration.

In addition, in order to satisfy both a metal gate process and a high-temperature process for usual MOS transistors, a metal gate last process is used for actual products, in which a metal gate is formed after a high-temperature process (IEDM 2007 K. Mistry, et. al., pp. 247-250). The gate is formed using polysilicon, and then an interlayer insulating film is deposited. Then, the polysilicon gate is exposed by chemical mechanical polishing and etched, followed by deposition of a metal. Therefore, in order to satisfy both the metal gate process and the high-temperature process, the metal gate last process must be used for SGT, in which a metal gate is formed after the high-temperature process. Since, in the SGT, the upper surface of the pillar-shaped semiconductor layer is higher than the gate, some consideration is required for using the metal gate last process.

In addition, usual MOS transistors use a first insulating film in order to decrease a parasitic capacitance between gate wiring and a substrate. For example, in FINFET (IEDM 2010 CC. Wu, et. al., 27.1.1-27.1.4.), a first insulating film is formed around a fin-shaped semiconductor layer and then etched back to expose the fin-shaped semiconductor layer, thereby decreasing the parasitic capacitance between the gate wiring and the substrate. Also, in SGT, the first insulating film must be used for decreasing the parasitic capacitance between the gate wiring and the substrate. The SGT includes the pillar-shaped semiconductor layer in addition to the fin-shaped semiconductor layer, and thus some consideration is required for forming the pillar-shaped semiconductor layer.

SUMMARY

Accordingly, an object is to decrease a parasitic capacitance between a gate wiring and a substrate, provide a SGT manufacturing method using a gate last process, and provide a resulting SGT structure.

A method for manufacturing a semiconductor device of the present invention includes:

etching a semiconductor substrate to form a fin-shaped semiconductor layer;

after forming the fin-shaped semiconductor layer, depositing a first insulating film around the fin-shaped semiconductor layer;

etching back the first insulating film to expose an upper portion of the fin-shaped semiconductor layer;

forming a second resist so as to be perpendicular to the fin-shaped semiconductor layer;

etching the fin-shaped semiconductor layer to form a pillar-shaped semiconductor layer, such that a portion where the fin-shaped semiconductor layer and the second resist intersect at right angles defines the pillar-shaped semiconductor layer.

In another aspect, a method for manufacturing a semiconductor device of the present invention includes: a first step of forming a fin-shaped semiconductor layer on a semiconductor substrate, forming a first insulating film around the fin-shaped semiconductor layer, and forming a pillar-shaped semiconductor layer on the fin-shaped semiconductor layer, the width of the pillar-shaped semiconductor layer being equal to the width of the fin-shaped semiconductor layer;

a second step of, after the first step, forming diffusion layers by implanting impurities in an upper portion of the pillar-shaped semiconductor layer, an upper portion of the fin-shaped semiconductor layer, and a lower portion of the pillar-shaped semiconductor layer;

a third step of, after the second step, forming a gate insulating film, a polysilicon gate electrode, and a polysilicon gate wiring so that the gate insulating film covers the periphery and the top of the pillar-shaped semiconductor layer, the polysilicon gate electrode covers the gate insulating film, and after the polysilicon gate electrode and the polysilicon gate wiring are formed, the upper surface of polysilicon is higher than the gate insulating film on the diffusion layer formed in the upper portion of the pillar-shaped semiconductor layer;

a fourth step of, after the third step, forming a silicide in an upper portion of the diffusion layer in the upper portion of the fin-shaped semiconductor layer;

a fifth step of, after the fourth step, depositing an interlayer insulating film, exposing the polysilicon gate electrode and the polysilicon gate wiring, etching the polysilicon gate electrode and the polysilicon gate wiring, and then depositing a metal to form a metal gate electrode and a metal gate wiring, the metal gate wiring being connected to the metal gate electrode and extending in a direction perpendicular to the fin-shaped semiconductor layer; and a sixth step of, after the fifth step, forming a contact so as to make direct contact between the contact and the diffusion layer in the upper portion of the pillar-shaped semiconductor layer.

The manufacturing method is also characterized in that a first resist is formed for forming the fin-shaped semiconductor layer on the semiconductor substrate; the semiconductor substrate is etched to form the fin-shaped semiconductor layer and the first resist is removed; the first insulating film is deposited around the fin-shaped semiconductor layer and then etched back to expose an upper portion of the fin-shaped semiconductor layer; a second resist is formed to be perpendicular to the fin-shaped semiconductor layer; the fin-shaped semiconductor layer is etched; and then the second resist is removed to form the pillar-shaped semiconductor layer so that a portion where the fin-shaped semiconductor layer and the second resist intersect at right angles becomes the pillar-shaped semiconductor layer.

The manufacturing method is further characterized in that in a structure including the fin-shaped semiconductor layer formed on the semiconductor substrate, the first insulating film formed around the fin-shaped semiconductor layer, and the pillar-shaped semiconductor layer formed on the fin-shaped semiconductor layer, a second oxide film is deposited, a first nitride film is formed on the second oxide film, the first nitride film is etched to be left as a side wall, the diffusion layers are formed by impurity implantation in an upper portion of the pillar-shaped semiconductor layer and an upper portion of the fin-shaped semiconductor layer, and the first nitride film and the second oxide film are removed, followed by heat treatment.

The manufacturing method is further characterized in that in a structure including the fin-shaped semiconductor layer formed on the semiconductor substrate, the first insulating film formed around the fin-shaped semiconductor layer, the pillar-shaped semiconductor layer formed on the fin-shaped semiconductor layer, the diffusion layer formed in the upper portion of the fin-shaped semiconductor layer and in the lower portion of the pillar-shaped semiconductor layer, and the diffusion layer formed in the upper portion of the pillar-shaped semiconductor layer, the gate insulating film is formed, polysilicon is deposited and then planarized so that after planarization, the upper surface of the polysilicon is higher than the gate insulating film on the diffusion layer formed in the upper portion of the pillar-shaped semiconductor layer, a second nitride film is deposited, a third resist is formed for forming the polysilicon gate electrode and the polysilicon gate wiring, the second nitride film is etched, the polysilicon is etched to form the polysilicon gate electrode and the polysilicon gate wiring, the gate insulating film is etched, and the third resist is removed.

The manufacturing method is further characterized in that a third nitride film is deposited and then etched to be left as a side wall, and a metal is deposited to form a silicide in an upper portion of the diffusion layer in the upper portion of the fin-shaped semiconductor layer.

The manufacturing method is further characterized in that a fourth nitride film is deposited, the interlayer insulating film is deposited and then planarized, the polysilicon gate electrode and the polysilicon gate wiring are exposed, the polysilicon gate electrode and the polysilicon gate wiring are removed, a metal is filled in a portion from which the polysilicon gate electrode and the polysilicon gate wiring have been removed, and the metal is etched to expose the gate insulating film on the diffusion layer in the upper portion of the pillar-shaped semiconductor layer, thereby forming the metal gate electrode and the metal gate wiring.

A semiconductor device of the present invention includes: a fin-shaped semiconductor layer formed on a semiconductor substrate; a first insulating film formed around the fin-shaped semiconductor layer; a pillar-shaped semiconductor layer formed on the fin-shaped semiconductor layer, the width of the pillar-shaped semiconductor layer being equal to the width of the fin-shaped semiconductor layer; a diffusion layer formed in an upper portion of the fin-shaped semiconductor layer and a lower portion of the pillar-shaped semiconductor layer; a diffusion layer formed in an upper portion of the pillar-shaped semiconductor layer; a silicide formed in an upper portion of the diffusion layer in the upper portion of the fin-shaped semiconductor layer; a gate insulating film formed around the pillar-shaped semiconductor layer; a metal gate electrode formed around the gate insulating film: a metal gate wiring connected to the metal gate electrode and extending in a direction perpendicular to the fin-shaped semiconductor layer; and a contact formed on the diffusion layer formed in the upper portion of the pillar-shaped semiconductor layer so as to make direct contact between the contact and the diffusion layer formed in the upper portion of the pillar-shaped semiconductor layer.

According to the present invention, it is possible to decrease a parasitic capacitance between a gate wiring and a substrate, provide a SGT manufacturing method using a gate last process, and provide a resulting SGT structure.

The fin-shaped semiconductor layer, the first insulating film, and the pillar-shaped semiconductor layer are formed based on a conventional FINFET manufacturing method and thus can be easily formed.

In addition, a silicide is generally formed in an upper portion of the pillar-shaped semiconductor layer, but the silicide must be formed after a polysilicon gate is formed because the deposition temperature of polysilicon is higher than the silicide formation temperature.

Therefore, when the silicide is formed in an upper portion of a silicon column, a hole is formed on a polysilicon gate electrode after the polysilicon gate is formed, the silicide is formed after a side wall composed of an insulating film is formed on the side wall of the hole, and then the hole is filled with an insulating film, thereby causing the problem of increasing the number of manufacturing steps. Therefore, the diffusion layers are formed before the polysilicon gate electrode and the polysilicon gate wiring are formed, the pillar-shaped semiconductor layer is covered with the polysilicon gate electrode, and the silicide is formed only in an upper portion of the fin-shaped semiconductor layer. Therefore, a usual metal gate last manufacturing method can be used, in which a gate is formed using polysilicon, the interlayer insulating film is deposited, the polysilicon gate is exposed by chemical mechanical polishing and then etched, and then a metal is deposited, thereby facilitating the formation of metal gate SGT.

BRIEF DESCRIPTION OF THE DRAWING

FIG. 1A is a plan view of a semiconductor device according to the present invention, FIG. 1B is a sectional view taken along line X-X' in FIG. 1A, and FIG. 1C is a sectional view taken along line Y-Y' in FIG. 1A.

FIG. 2A is a plan view of a method for manufacturing a semiconductor device according to the present invention, FIG. 2B is a sectional view taken along line X-X' in FIG. 2A, and FIG. 2C is a sectional view taken along line Y-Y' in FIG. 2A.

FIG. 5A is a plan view of a method for manufacturing a semiconductor device according to the present invention, FIG. 5B is a sectional view taken along line X-X' in FIG. 5A, and FIG. 5C is a sectional view taken along line Y-Y' in FIG. 5A.

FIG. 7A is a plan view of a method for manufacturing a semiconductor device according to the present invention, FIG. 7B is a sectional view taken along line X-X' in FIG. 7A, and FIG. 7C is a sectional view taken along line Y-Y' in FIG. 7A.

FIG. 8A is a plan view of a method for manufacturing a semiconductor device according to the present invention, FIG. 8B is a sectional view taken along line X-X' in FIG. 8A, and FIG. 8C is a sectional view taken along line Y-Y' in FIG. 8A.

FIG. 10A is a plan view of a method for manufacturing a semiconductor device according to the present invention, FIG. 10B is a sectional view taken along line X-X' in FIG. 10A, and FIG. 10C is a sectional view taken along line Y-Y' in FIG. 10A.

FIG. 14A is a plan view of a method for manufacturing a semiconductor device according to the present invention, FIG. 14B is a sectional view taken along line X-X' in FIG. 14A, and FIG. 14C is a sectional view taken along line Y-Y' in FIG. 14A.

FIG. 15A is a plan view of a method for manufacturing a semiconductor device according to the present invention, FIG. 15B is a sectional view taken along line X-X' in FIG. 15A, and FIG. 15C is a sectional view taken along line Y-Y' in FIG. 15A.

FIG. 16A is a plan view of a method for manufacturing a semiconductor device according to the present invention, FIG. 16B is a sectional view taken along line X-X' in FIG. 16A, and FIG. 16C is a sectional view taken along line Y-Y' in FIG. 16A.

FIG. 17A is a plan view of a method for manufacturing a semiconductor device according to the present invention, FIG. 17B is a sectional view taken along line X-X' in FIG. 17A, and FIG. 17C is a sectional view taken along line Y-Y' in FIG. 17A.

FIG. 18A is a plan view of a method for manufacturing a semiconductor device according to the present invention, FIG. 18B is a sectional view taken along line X-X' in FIG. 18A, and FIG. 18C is a sectional view taken along line Y-Y' in FIG. 18A.

FIG. 19A is a plan view of a method for manufacturing a semiconductor device according to the present invention, FIG. 19B is a sectional view taken along line X-X' in FIG. 19A, and FIG. 19C is a sectional view taken along line Y-Y' in FIG. 19A.

FIG. 20A is a plan view of a method for manufacturing a semiconductor device according to the present invention, FIG. 20B is a sectional view taken along line X-X' in FIG. 20A, and FIG. 20C is a sectional view taken along line Y-Y' in FIG. 20A.

FIG. 21A is a plan view of a method for manufacturing a semiconductor device according to the present invention, FIG. 21B is a sectional view taken along line X-X' in FIG. 21A, and FIG. 21C is a sectional view taken along line Y-Y' in FIG. 21A.

FIG. 22A is a plan view of a method for manufacturing a semiconductor device according to the present invention, FIG. 22B is a sectional view taken along line X-X' in FIG. 22A, and FIG. 22C is a sectional view taken along line Y-Y' in FIG. 22A.

FIG. 23A is a plan view of a method for manufacturing a semiconductor device according to the present invention, FIG. 23B is a sectional view taken along line X-X' in FIG. 23A, and FIG. 23C is a sectional view taken along line Y-Y' in FIG. 23A.

FIG. 28A is a plan view of a method for manufacturing a semiconductor device according to the present invention, FIG. 28B is a sectional view taken along line X-X' in FIG. 28A, and FIG. 28C is a sectional view taken along line Y-Y' in FIG. 28A.

FIG. 31A is a plan view of a method for manufacturing a semiconductor device according to the present invention, FIG. 31B is a sectional view taken along line X-X' in FIG. 31A, and FIG. 31C is a sectional view taken along line Y-Y' in FIG. 31A.

FIG. 32A is a plan view of a method for manufacturing a semiconductor device according to the present invention, FIG. 32B is a sectional view taken along line X-X' in FIG. 32A, and FIG. 32C is a sectional view taken along line Y-Y' in FIG. 32A.

FIG. 34A is a plan view of a method for manufacturing a semiconductor device according to the present invention, FIG. 34B is a sectional view taken along line X-X' in FIG. 34A, and FIG. 34C is a sectional view taken along line Y-Y' in FIG. 34A.

FIG. 36A is a plan view of a method for manufacturing a semiconductor device according to the present invention, FIG. 36B is a sectional view taken along line X-X' in FIG. 36A, and FIG. 36C is a sectional view taken along line Y-Y' in FIG. 36A.

FIG. 38A is a plan view of a method for manufacturing a semiconductor device according to the present invention, FIG. 38B is a sectional view taken along line X-X' in FIG. 38A, and FIG. 38C is a sectional view taken along line Y-Y' in FIG. 38A.

FIG. 41A is a plan view of a method for manufacturing a semiconductor device according to the present invention, FIG. 41B is a sectional view taken along line X-X' in FIG. 41A, and FIG. 41C is a sectional view taken along line Y-Y' in FIG. 41A.

FIG. 42A is a plan view of a method for manufacturing a semiconductor device according to the present invention, FIG. 42B is a sectional view taken along line X-X' in FIG. 42A, and FIG. 42C is a sectional view taken along line Y-Y' in FIG. 42A.

DETAILED DESCRIPTION

A manufacturing process for forming a SGT structure according to an embodiment of the present invention is described below with reference to FIGS. 2A-C to 42A-C.

First, a manufacturing method for forming a fin-shaped semiconductor layer on a semiconductor substrate, forming a first insulating film around the fin-shaped semiconductor layer, and forming a pillar-shaped semiconductor layer on the fin-shaped semiconductor layer is described. As shown in FIGS. 2A-C, a first resist 102 is formed for forming a fin-shaped semiconductor layer on a semiconductor substrate 101. In one embodiment, the semiconductor substrate can be a silicon substrate, the fin-shaped semiconductor layer can be a fin-shaped semiconductor layer silicon layer, and the pillar-shaped semiconductor layer can be a pillar-shaped silicon layer.

Figure 3A:
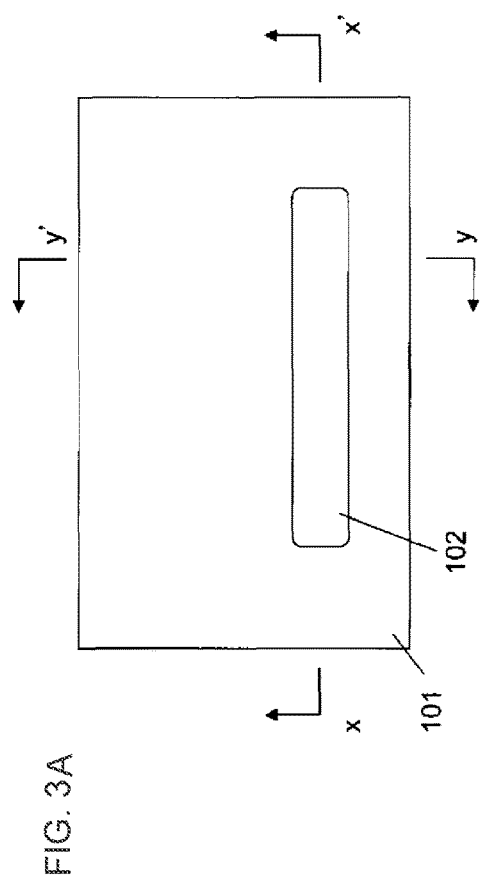
FIG. 3A is a plan view of a method for manufacturing a semiconductor device according to the present invention.
Figure 3C:
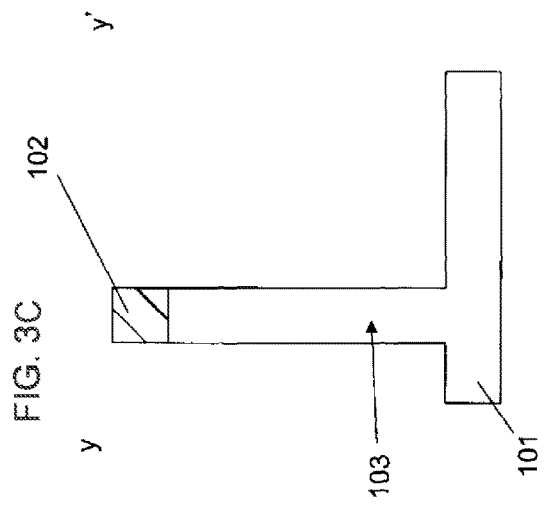
FIG. 3C is a sectional view taken along line Y-Y' in FIG. 3A.
Figure 3B:
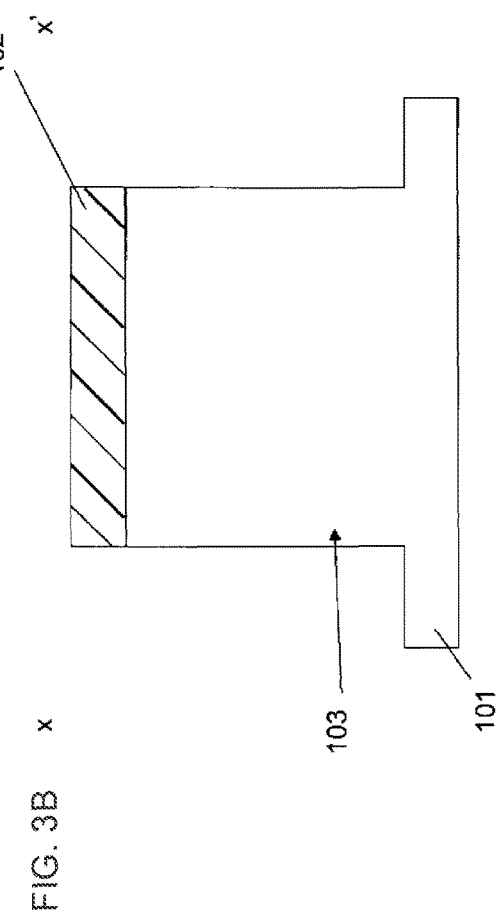
FIG. 3B is a sectional view taken along line X-X' in FIG. 3A.

As shown in FIGS. 3A-C, the semiconductor substrate 101 is etched to form a fin-shaped semiconductor layer 103. Although, in this case, the fin-shaped semiconductor layer is formed using the resist as a mask, a hard mask such as an oxide film or a nitride film may be used.

Figure 4A:
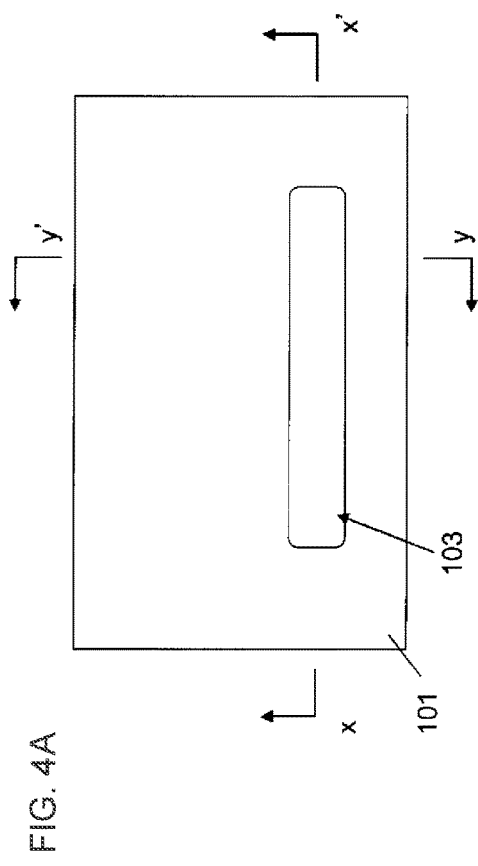
FIG. 4A is a plan view of a method for manufacturing a semiconductor device according to the present invention.
Figure 4C:
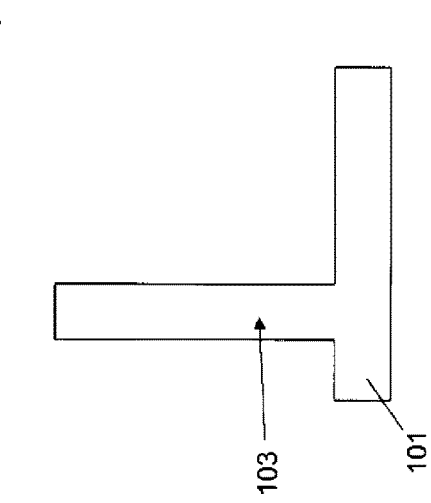
FIG. 4C is a sectional view taken along line Y-Y' in FIG. 4A.
Figure 4B:
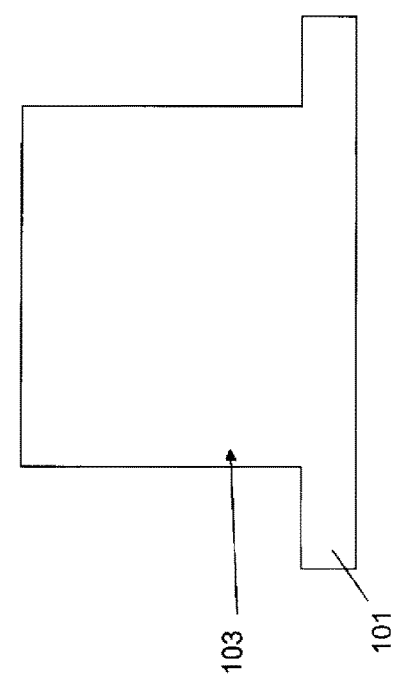
FIG. 4B is a sectional view taken along line X-X' in FIG. 4A.

As shown in FIGS. 4A-C, the first resist 102 is removed.

As shown in FIGS. 5A-C, a first insulating film 104 is deposited around the fin-shaped semiconductor layer 103. As the first insulating film, an oxide film formed by high-density plasma, or an oxide film formed by low-pressure chemical vapor deposition may be used.

Figure 6A:
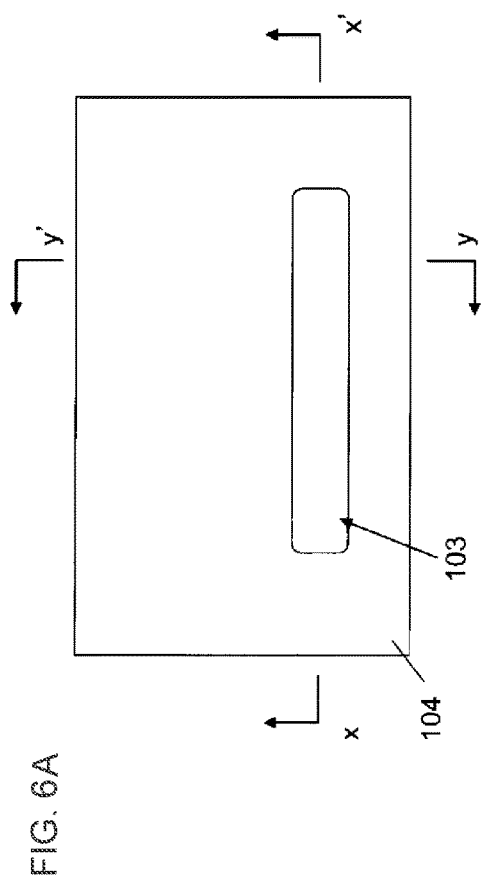
FIG. 6A is a plan view of a method for manufacturing a semiconductor device according to the present invention.
Figure 6C:
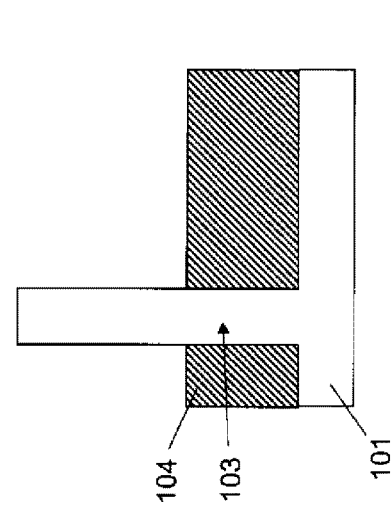
FIG. 6C is a sectional view taken along line Y-Y' in FIG. 6A.
Figure 6B:
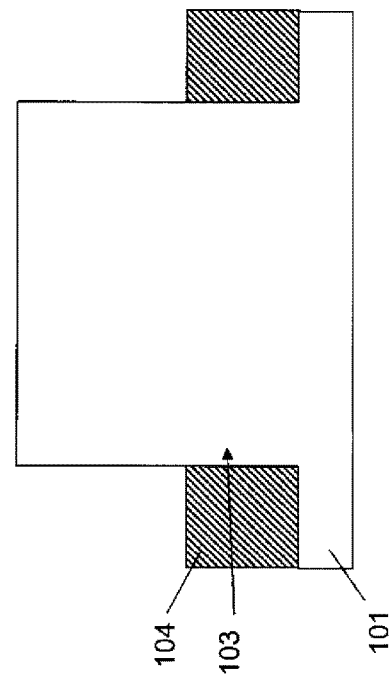
FIG. 6B is a sectional view taken along line X-X' in FIG. 6A.

As shown in FIGS. 6A-C, the first insulating film 104 is etched back to expose an upper portion of the fin-shaped semiconductor layer 103. The steps up to this step are the same as in the method for forming a fin-shaped semiconductor layer of Japanese Unexamined Patent Application Publication No. 2-188966.

As shown in FIGS. 7A-C, a second resist 105 is formed so as to be perpendicular to the fin-shaped semiconductor layer 103. A portion where the fin-shaped semiconductor layer 103 and the second resist 105 intersect at right angles defines a pillar-shaped semiconductor layer. Since a linear resist can be used, the resist is unlikely to fall after patterning, thereby realizing a stable process.

As shown in FIGS. 8A-C, the fin-shaped semiconductor layer 103 is etched. A portion where the fin-shaped semiconductor layer 103 and the second resist 105 intersect at right angles defines the pillar-shaped semiconductor layer 106. Therefore, the width of the pillar-shaped semiconductor layer 106 is equal to the width of the fin-shaped semiconductor layer. As a result, a structure is formed, in which the pillar-shaped semiconductor layer 106 is formed in an upper portion of the fin-shaped semiconductor layer 103, and the first insulating film 104 is formed around the fin-shaped semiconductor layer 103.

Figure 9C:
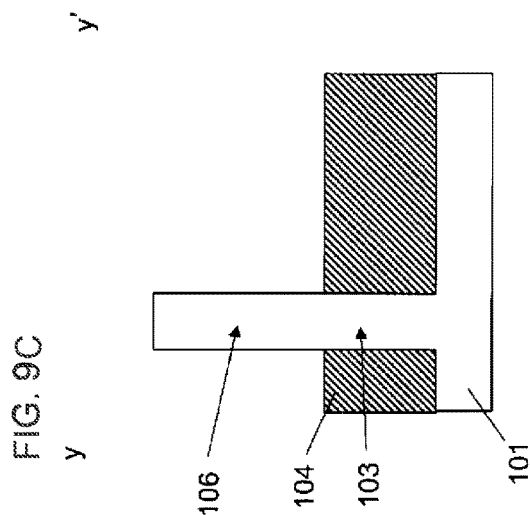
FIG. 9C is a sectional view taken along line Y-Y' in FIG. 9A.
Figure 9A:
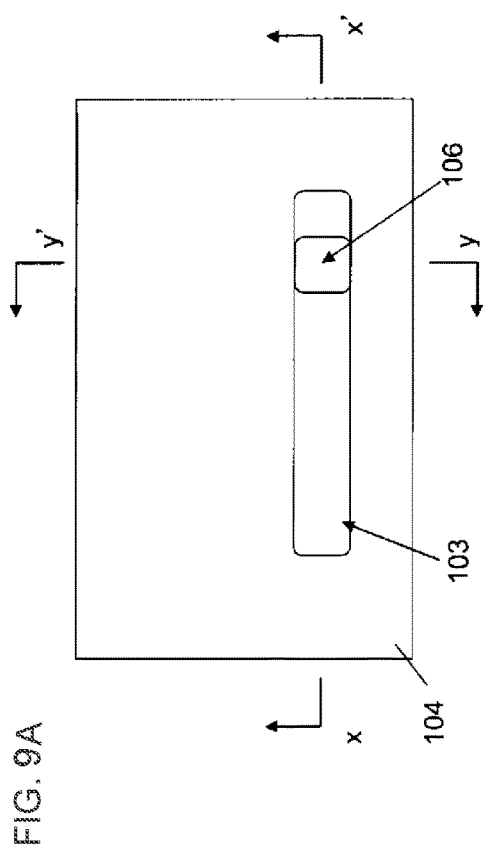
FIG. 9A is a plan view of a method for manufacturing a semiconductor device according to the present invention.
Figure 9B:
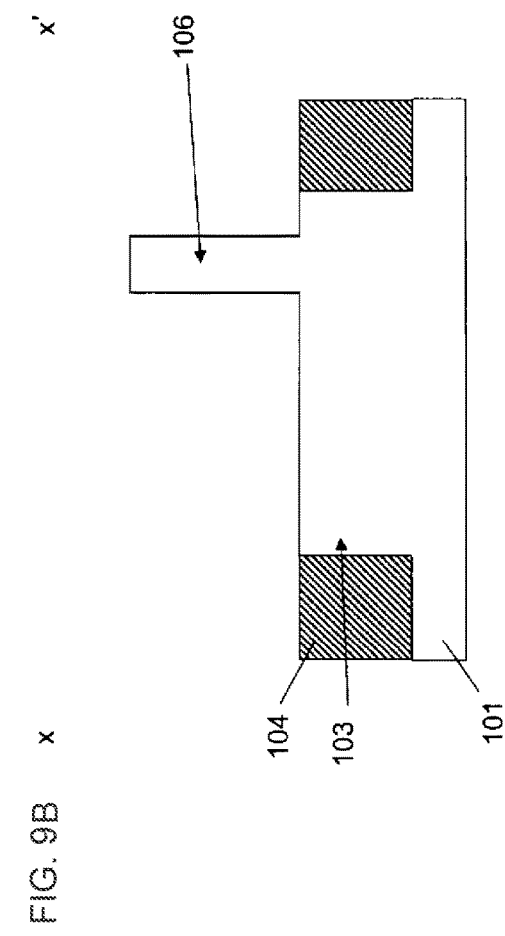
FIG. 9B is a sectional view taken along line X-X' in FIG. 9A.

As shown in FIGS. 9A-C, the second resist 105 is removed.

Next, a description is given of a manufacturing method for forming diffusion layers by implanting impurities in an upper portion of the pillar-shaped semiconductor layer, an upper portion of the fin-shaped semiconductor layer, and a lower portion of the pillar-shaped semiconductor layer in order to use a gate-last process. As shown in FIGS. 10A-C, a second oxide film 107 is deposited, and a first nitride film 108 is formed. Since an upper portion of the pillar-shaped semiconductor layer is subsequently covered with a gate insulating film and a polysilicon gate electrode, a diffusion layer is formed in an upper portion of the pillar-shaped semiconductor layer before covering of the pillar-shaped semiconductor layer.

Figure 11A:
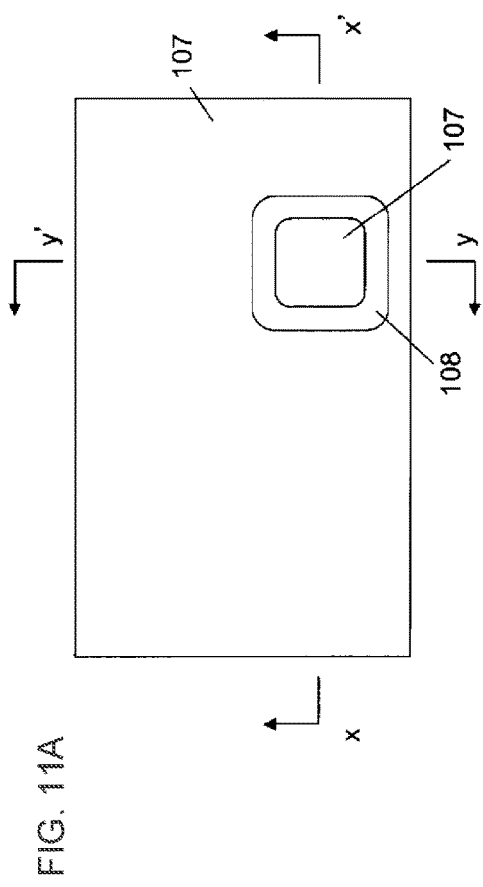
FIG. 11A is a plan view of a method for manufacturing a semiconductor device according to the present invention.
Figure 11C:
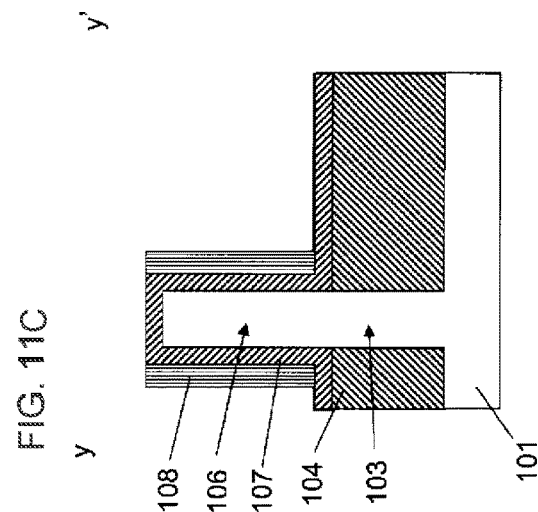
FIG. 11C is a sectional view taken along line Y-Y' in FIG. 11A.
Figure 11B:
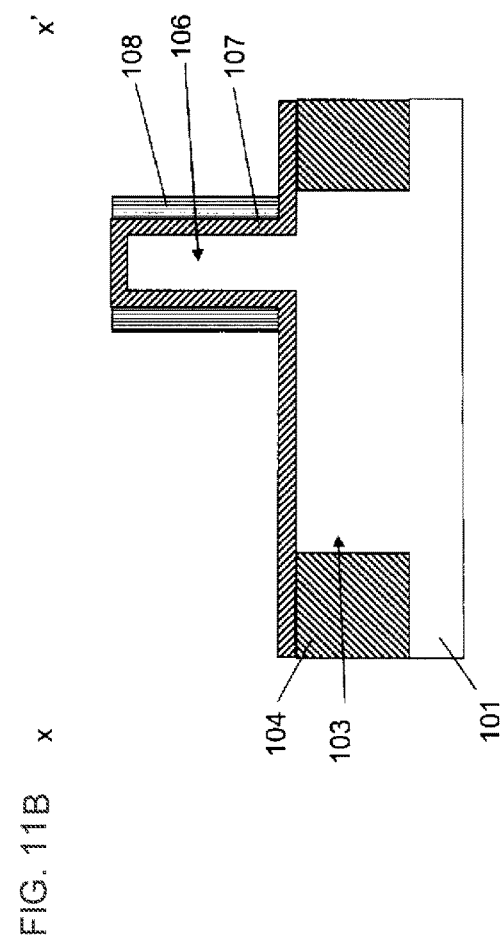
FIG. 11B is a sectional view taken along line X-X' in FIG. 11A.

As shown in FIGS. 11A-C, the first nitride film 108 is etched to be left as a wide wall.

Figure 12A:
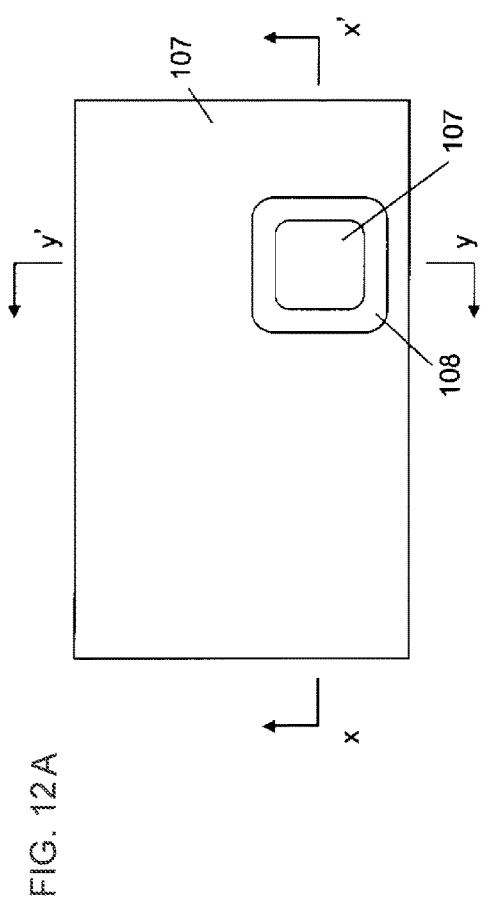
FIG. 12A is a plan view of a method for manufacturing a semiconductor device according to the present invention.
Figure 12C:
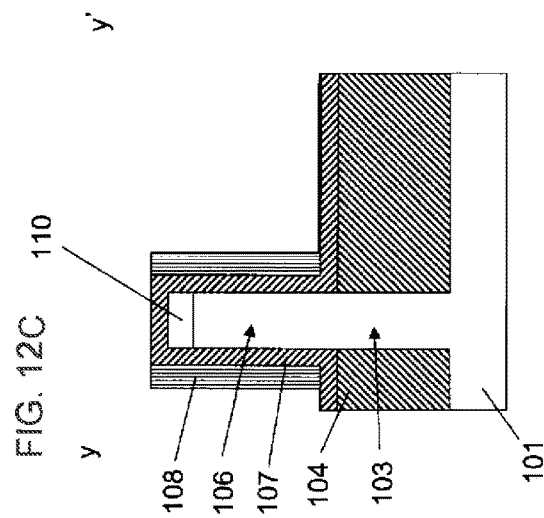
FIG. 12C is a sectional view taken along line Y-Y' in FIG. 12A.
Figure 12B:
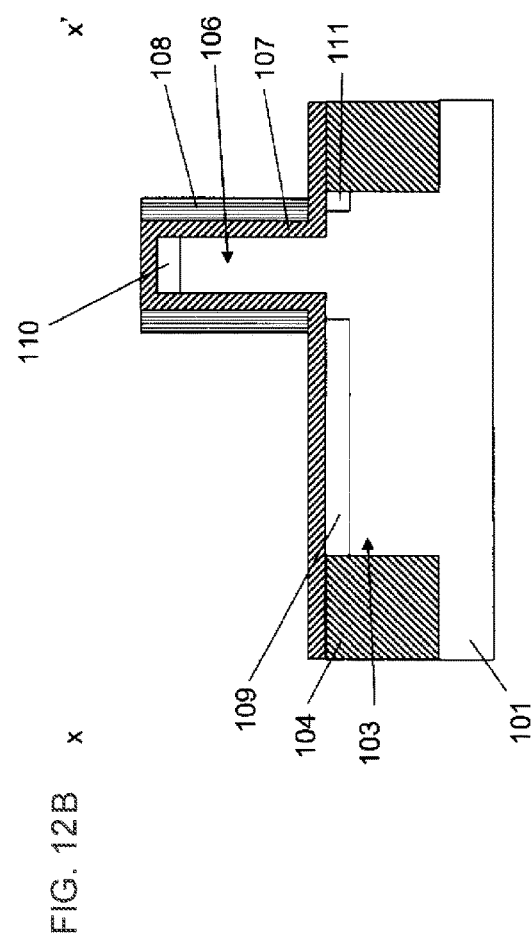
FIG. 12B is a sectional view taken along line X-X' in FIG. 12A.

As shown in FIGS. 12A-C, impurities such as arsenic, phosphorus, or boron are implanted to form a diffusion layer 110 in an upper portion of the pillar-shaped semiconductor layer, and diffusion layers 109 and 111 in an upper portion of the fin-shaped semiconductor layer 103.

Figure 13C:
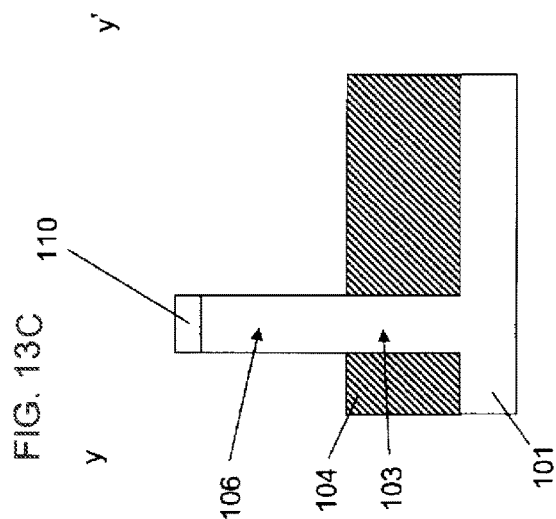
FIG. 13C is a sectional view taken along line Y-Y' in FIG. 13A.
Figure 13A:
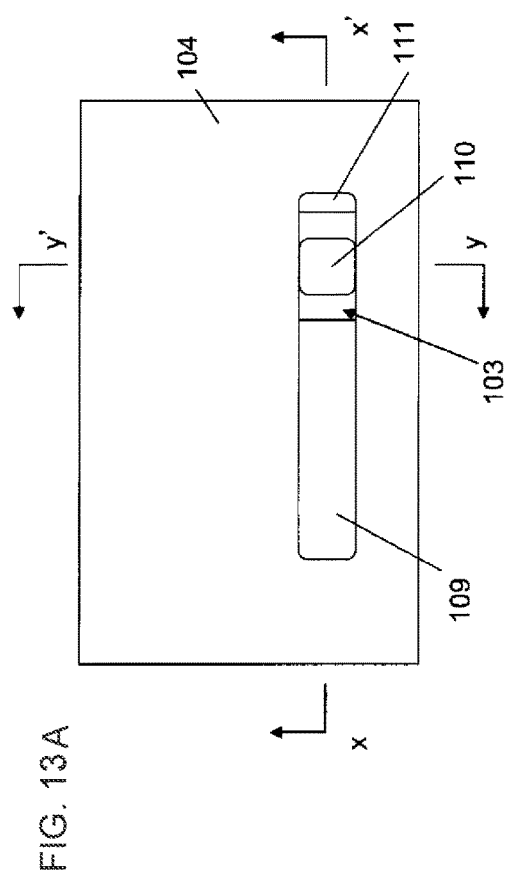
FIG. 13A is a plan view of a method for manufacturing a semiconductor device according to the present invention.
Figure 13B:
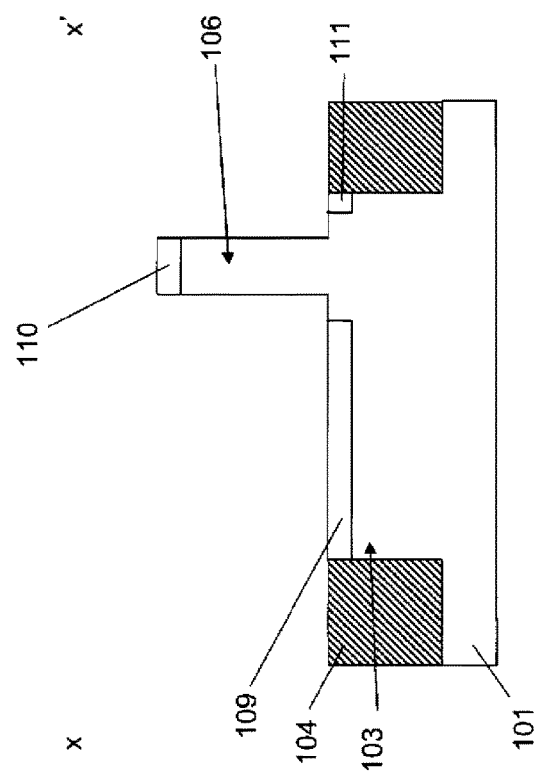
FIG. 13B is a sectional view taken along line X-X' in FIG. 13A.

As shown in FIGS. 13A-C, the first nitride film 108 and the second oxide film 107 are removed.

As shown in FIGS. 14A-C, heat treatment is performed. The diffusion layers 109 and 111 in an upper portion of the fin-shaped semiconductor layer 103 are brought into contact with each other to form a diffusion layer 112. As described above, in order to use the gate-last process, the diffusion layers 110 and 112 are formed by impurity implantation in an upper portion of the pillar-shaped semiconductor layer and in an upper portion of the fin-shaped semiconductor layer and a lower portion of the pillar-shaped semiconductor layer.

Next, a description is given of a manufacturing method for forming a polysilicon gate electrode and a polysilicon gate wiring using polysilicon in order to use the gate-last process. In order to use the gate-last process, an interlayer insulating film is deposited, and then the polysilicon gate electrode and the polysilicon gate wiring are exposed by chemical mechanical polishing. Therefore, it is necessary to prevent an upper portion of the pillar-shaped semiconductor layer from being exposed by chemical mechanical polishing.

As shown in FIGS. 15A-C, a gate insulating film 113 is formed, and polysilicon 114 is deposited and then planarized. After planarization, the upper surface of the polysilicon is higher than the gate insulating film 113 disposed on the diffusion layer 110 in an upper portion of the pillar-shaped semiconductor layer 106. As a result, when in order to use the gate-last process, the polysilicon gate electrode and the polysilicon gate wiring are exposed by chemical mechanical polishing after the interlayer insulating film is deposited, the upper portion of the pillar-shaped semiconductor layer is not exposed by chemical mechanical polishing.

In addition, a second nitride film 115 is deposited. The second nitride film is one which inhibits the formation of silicide in upper portions of the polysilicon gate electrode and the polysilicon gate wiring when the silicide is formed in an upper portion of the fin-shaped semiconductor layer.

As shown in FIGS. 16A-C, a third resist 116 is formed for forming the polysilicon gate electrode and the polysilicon gate wiring. A portion corresponding to gate wiring is preferably perpendicular to the fin-shaped semiconductor layer 103. This is because a parasitic capacitance between the gate wiring and the substrate is decreased.

As shown in FIGS. 17A-C, the second nitride film 115 is etched.

As shown in FIGS. 18A-C, the polysilicon 114 is etched to form a polysilicon gate electrode 114a and a polysilicon gate wiring 114b.

As shown in FIGS. 19A-C, the gate insulating film 113 is etched.

As shown in FIGS. 20A-C, the third resist 116 is removed.

The manufacturing method for forming the polysilicon gate electrode and the polysilicon gate wiring using polysilicon in order to use the gate-last process is described above. After the polysilicon gate electrode 114a and the polysilicon gate wiring 114b are formed, the upper surface of polysilicon is higher than the gate insulating film 113 on the diffusion layer 110 in an upper portion of the pillar-shaped semiconductor layer 106.

Next, a manufacturing method for forming a silicide in an upper portion of the fin-shaped semiconductor layer is described. The silicide is not formed in upper portions of the polysilicon gate electrode 114a and the polysilicon gate wiring 114b and in the diffusion layer 110 in an upper portion of the pillar-shaped semiconductor layer 106. When the silicide is formed in the diffusion layer 110 in an upper portion of the pillar-shaped semiconductor layer 106, the manufacturing process is enlarged.

As shown in FIGS. 21A-C, a third nitride film 117 is deposited.

As shown in FIGS. 22A-C, the third nitride film 117 is etched to be left as a side wall.

As shown in FIGS. 23A-C, a metal such as nickel or cobalt is deposited to form silicide 118 in an upper portion of the diffusion layer 112 formed in an upper portion of the fin-shaped semiconductor layer 103. At this time, the polysilicon gate electrode 114a and the polysilicon gate wiring 114b are covered with the third nitride film 117 and the second nitride film 115, and the diffusion layer 110 in an upper portion of the pillar-shaped semiconductor layer 106 is covered with the gate insulating film 113, the polysilicon gate electrode 114a, and the polysilicon gate wiring 114b, and thus silicide is not formed in the polysilicon gate electrode 114a, the polysilicon gate wiring 114b, and the diffusion layer 110.

The manufacturing method for forming a silicide in an upper portion of the fin-shaped semiconductor layer is described above.

Next, a gate-last manufacturing method is described, in which the polysilicon gate electrode and the polysilicon wiring are exposed by chemical mechanical polishing after an interlayer insulting film is deposited, the polysilicon gate electrode and the polysilicon wiring are etched, and then a metal is deposited.

Figure 24A:
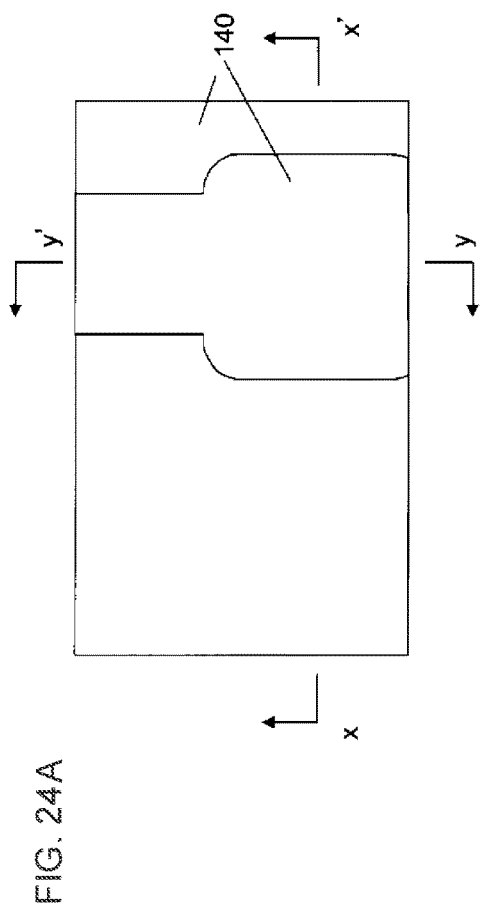
FIG. 24A is a plan view of a method for manufacturing a semiconductor device according to the present invention.
Figure 24C:
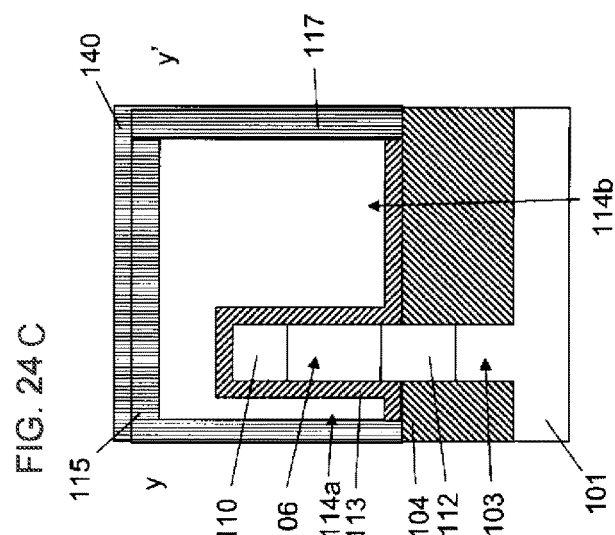
FIG. 24C is a sectional view taken along line Y-Y' in FIG. 24A.
Figure 24B:
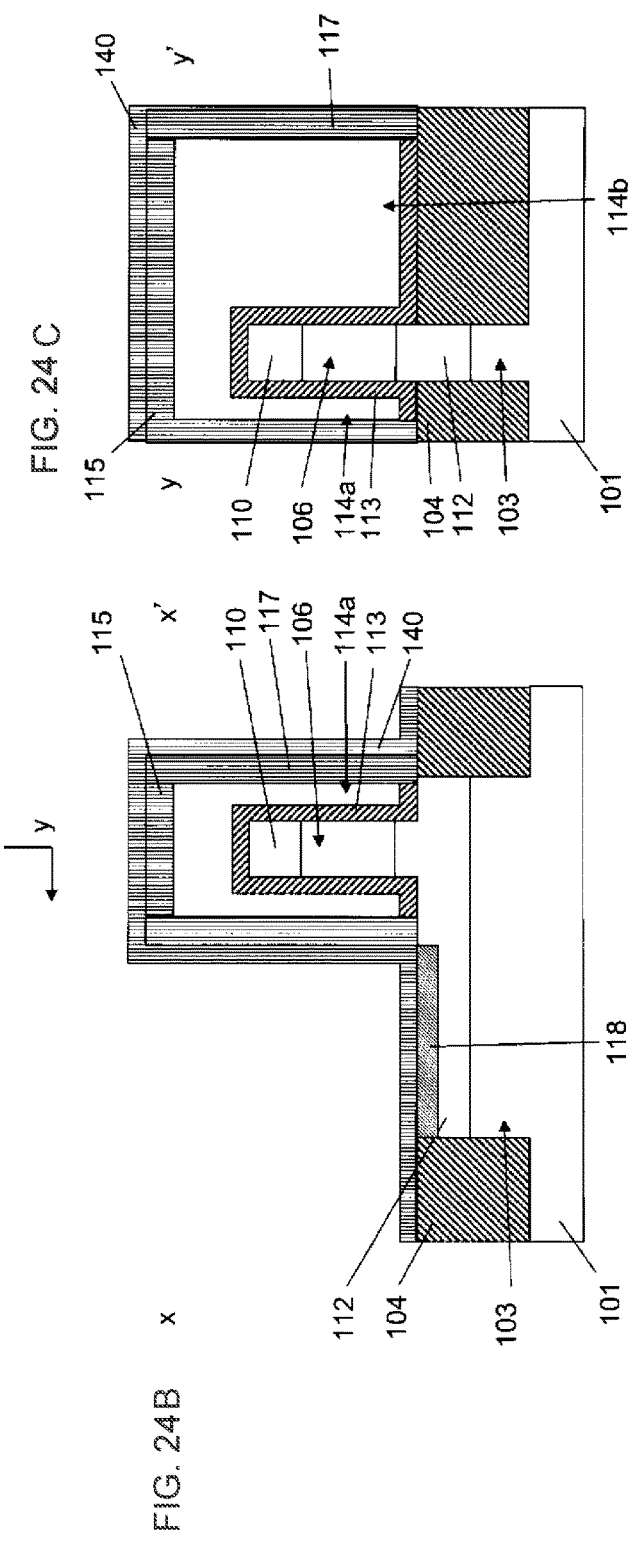
FIG. 24B is a sectional view taken along line X-X' in FIG. 24A.

As shown in FIGS. 24A-C, a fourth nitride film 140 is deposited for protecting the silicide 118.

Figure 25A:
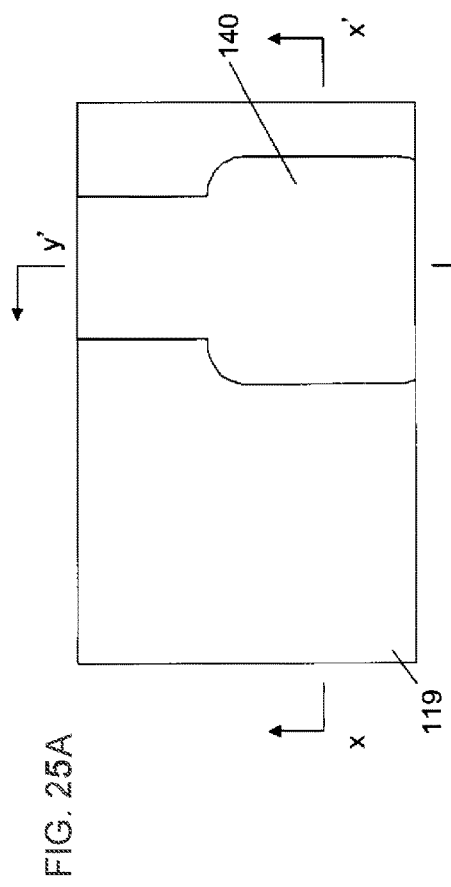
FIG. 25A is a plan view of a method for manufacturing a semiconductor device according to the present invention.
Figure 25C:
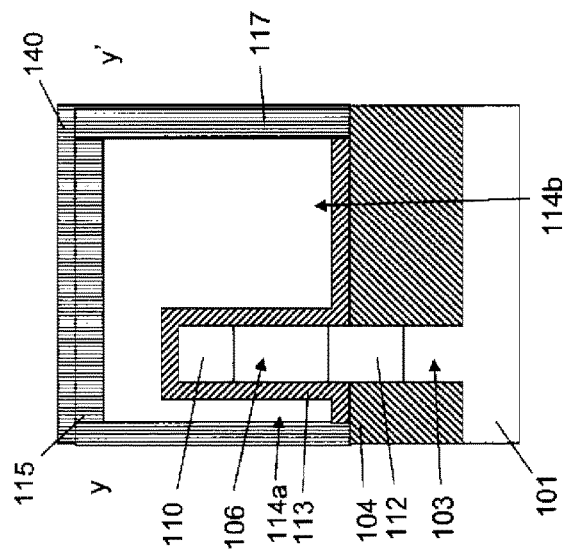
FIG. 25C is a sectional view taken along line Y-Y' in FIG. 25A.
Figure 25B:
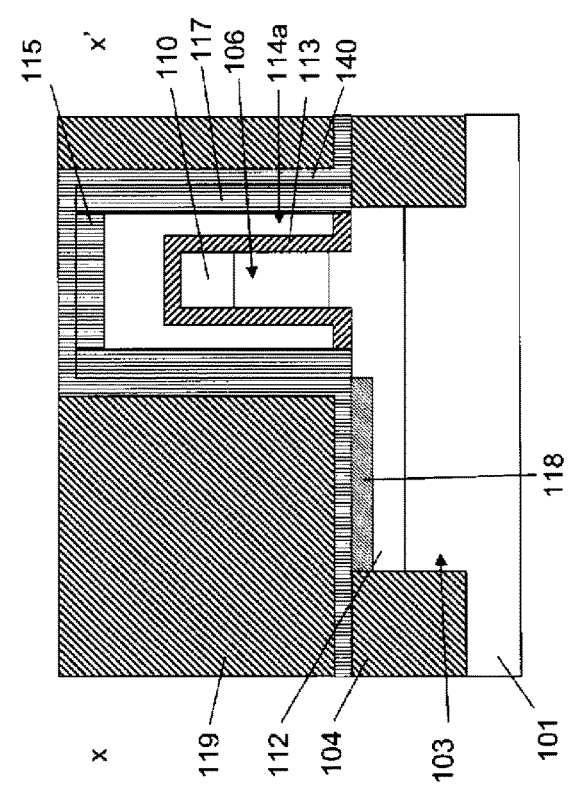
FIG. 25B is a sectional view taken along line X-X' in FIG. 25A.

As shown in FIGS. 25A-C, an interlayer insulating film 119 is deposited and then planarized by chemical mechanical polishing.

Figure 26A:
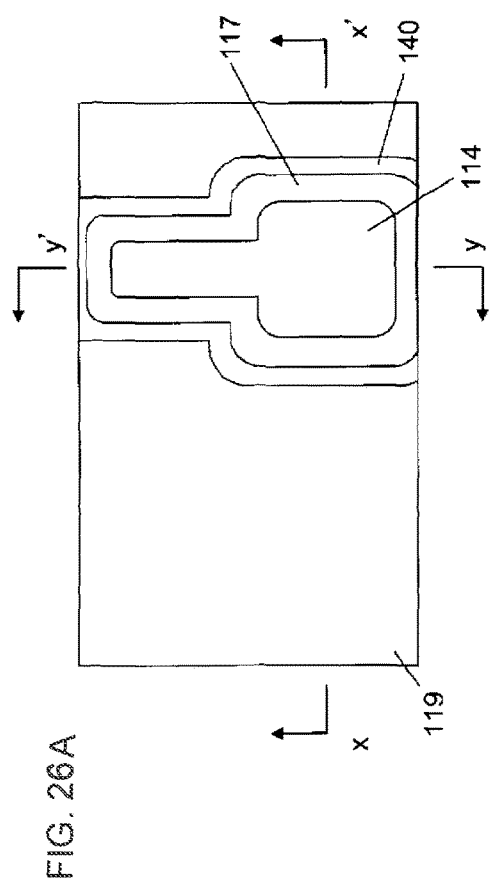
FIG. 26A is a plan view of a method for manufacturing a semiconductor device according to the present invention.
Figure 26C:
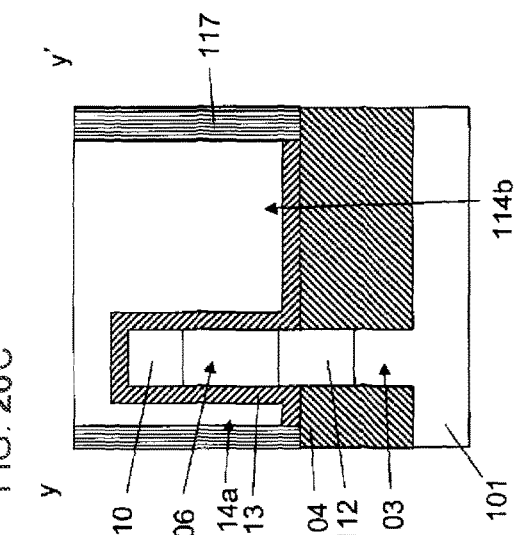
FIG. 26C is a sectional view taken along line Y-Y' in FIG. 26A.
Figure 26B:
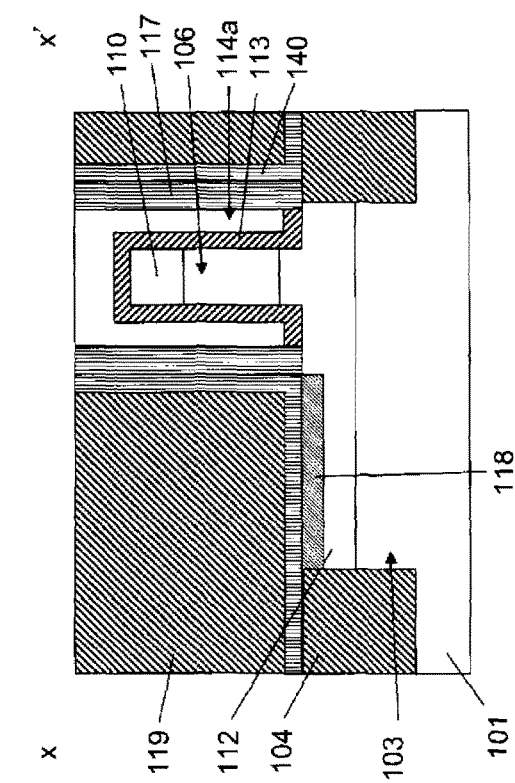
FIG. 26B is a sectional view taken along line X-X' in FIG. 26A.

As shown in FIGS. 26A-C, the polysilicon gate electrode 114a and the polysilicon gate wiring 114b are exposed by chemical mechanical polishing.

Figure 27A:
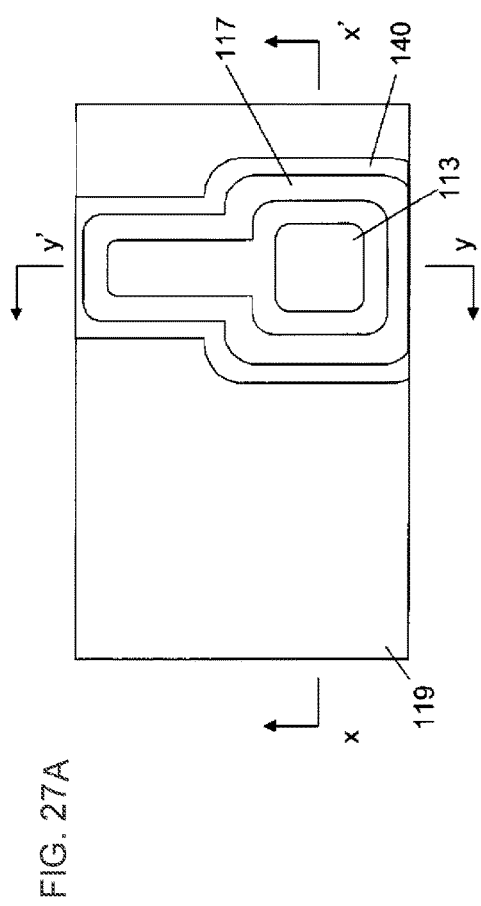
FIG. 27A is a plan view of a method for manufacturing a semiconductor device according to the present invention.
Figure 27C:
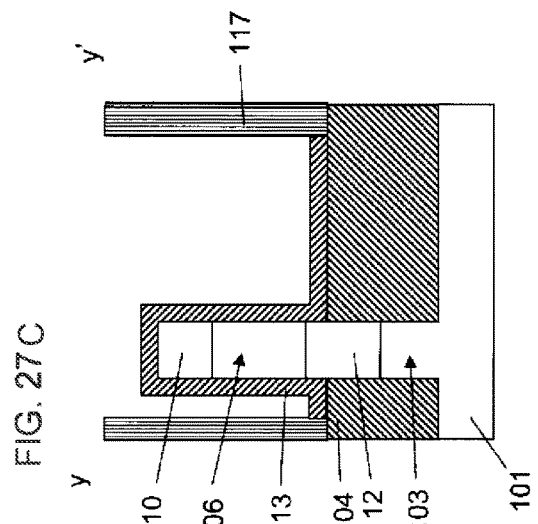
FIG. 27C is a sectional view taken along line Y-Y' in FIG. 27A.
Figure 27B:
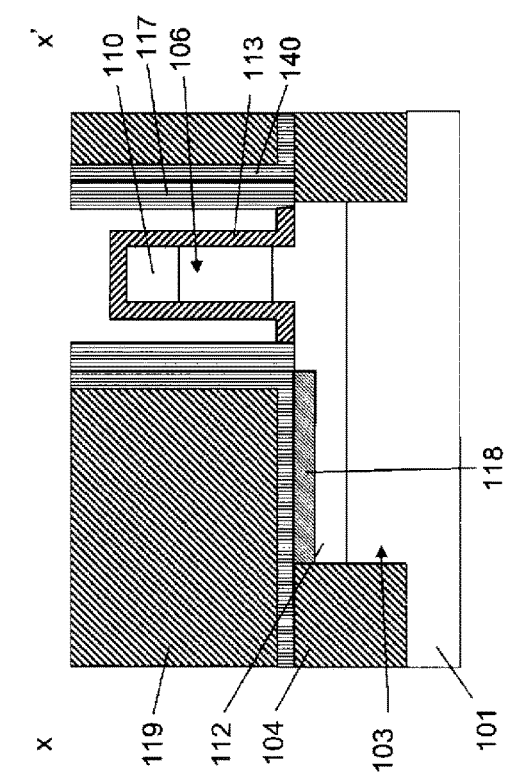
FIG. 27B is a sectional view taken along line X-X' in FIG. 27A.

As shown in FIGS. 27A-C, the polysilicon gate electrode 114a and the polysilicon gate wiring 114b are etched. Wet etching is preferred.

As shown in FIGS. 28A-C, a metal 120 is deposited and then planarized to fill, with the metal 120, a portion from which the polysilicon gate electrode 114a and the polysilicon gate wiring 114b have been removed. Atomic layer deposition is preferably used.

Figure 29A:
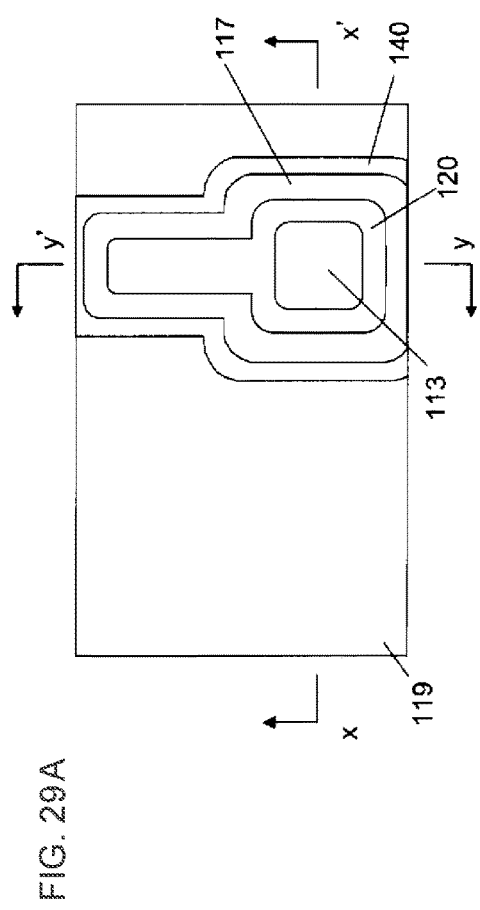
FIG. 29A is a plan view of a method for manufacturing a semiconductor device according to the present invention.
Figure 29C:
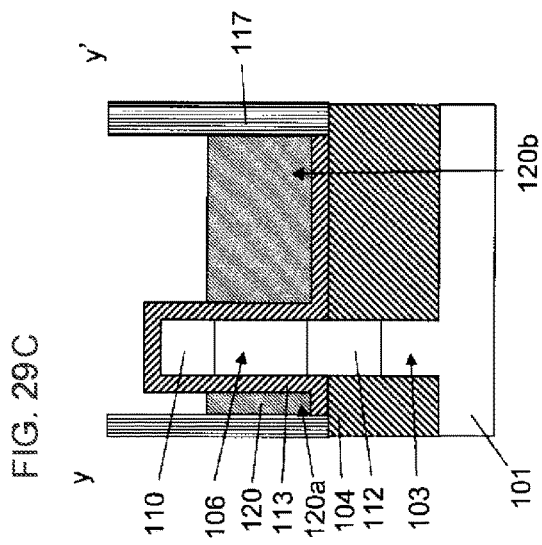
FIG. 29C is a sectional view taken along line Y-Y' in FIG. 29A.
Figure 29B:
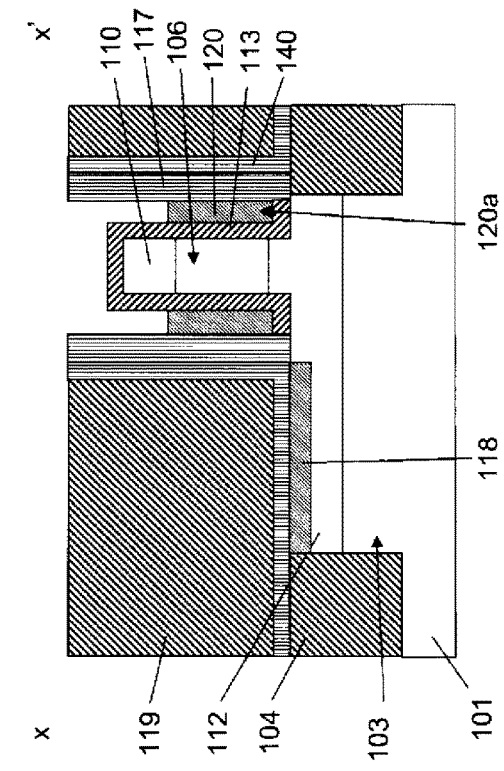
FIG. 29B is a sectional view taken along line X-X' in FIG. 29A.

As shown in FIGS. 29A-C, the metal 120 is etched to expose the gate insulating film 113 formed on the diffusion layer 110 in an upper portion of the pillar-shaped semiconductor layer 106. Consequently, a metal gate electrode 120a and a metal gate wiring 120b are formed. The gate-last manufacturing method is described above, in which after the interlayer insulating film is deposited, the polysilicon gate is exposed by chemical mechanical polishing, the polysilicon gate is etched, and then a metal is deposited.

Figure 30C:
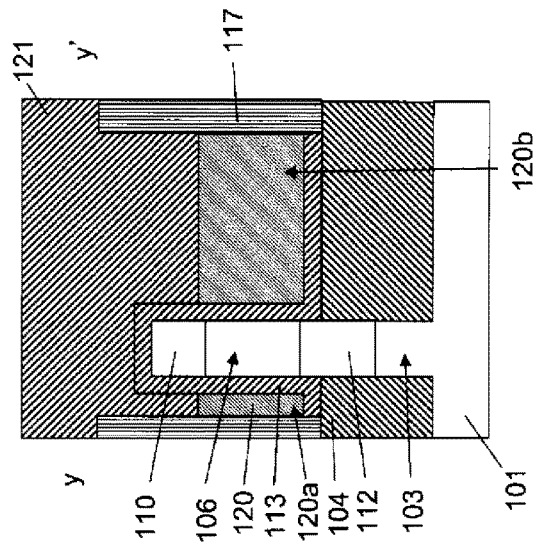
FIG. 30C is a sectional view taken along line Y-Y' in FIG. 30A.
Figure 30A:
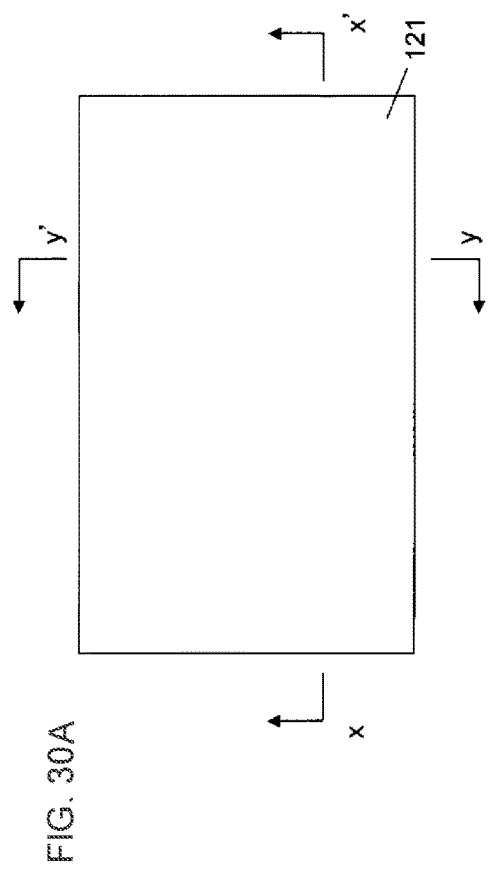
FIG. 30A is a plan view of a method for manufacturing a semiconductor device according to the present invention.
Figure 30B:
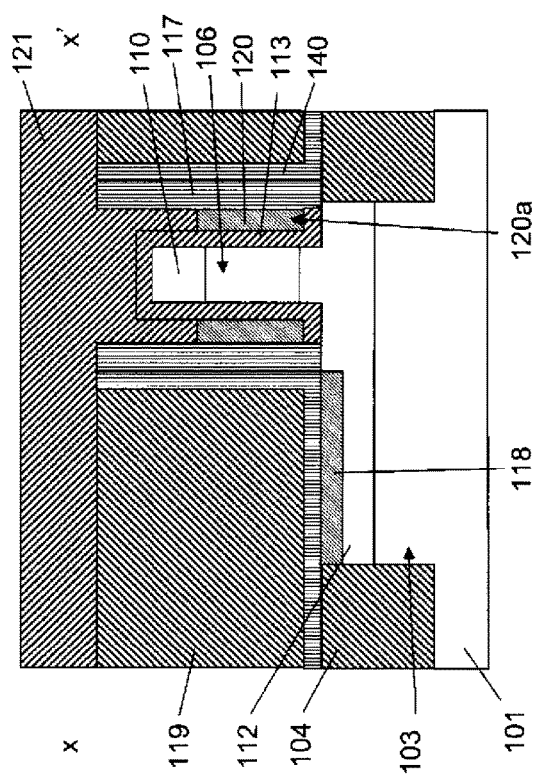
FIG. 30B is a sectional view taken along line X-X' in FIG. 30A.

Next, a manufacturing method for forming a contact is described. Since a silicide is not formed in the diffusion layer 110 in an upper portion of the pillar-shaped semiconductor layer 106, a contact is brought into direct contact with the diffusion layer 110 in an upper portion of the pillar-shaped semiconductor layer 106. As shown in FIGS. 30A-C, an interlayer insulating film 121 is deposited and then planarized.

As shown in FIGS. 31A-C, a fourth resist 122 is formed for forming a contact hole on the pillar-shaped semiconductor layer 106.

As shown in FIGS. 32A-C, the interlayer insulating film 121 is etched to form a contact hole 123.

Figure 33A:
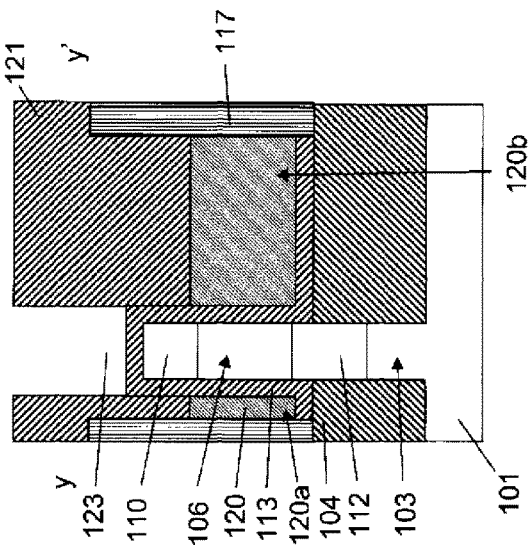
FIG. 33A is a plan view of a method for manufacturing a semiconductor device according to the present invention.
Figure 33B:
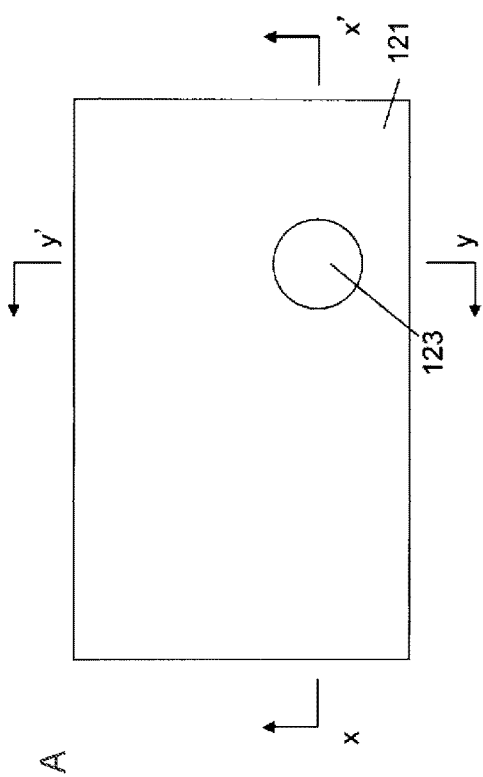
FIG. 33B is a sectional view taken along line X-X' in FIG. 33A.
Figure 33C:
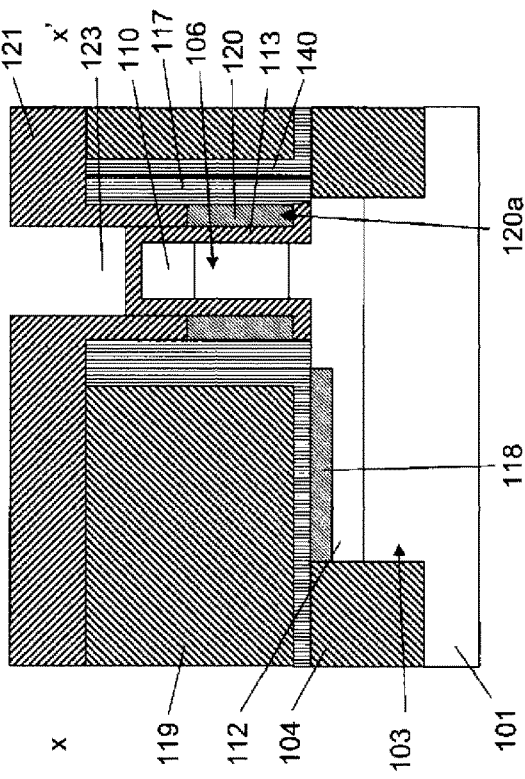
FIG. 33C is a sectional view taken along line Y-Y' in FIG. 33A.

As shown in FIGS. 33A-C, the fourth resist 122 is removed.

As shown in FIGS. 34A-C, a fifth resist 124 is formed for forming contact holes on the metal gate wiring 120b and on the fin-shaped semiconductor layer 103.

Figure 35C:
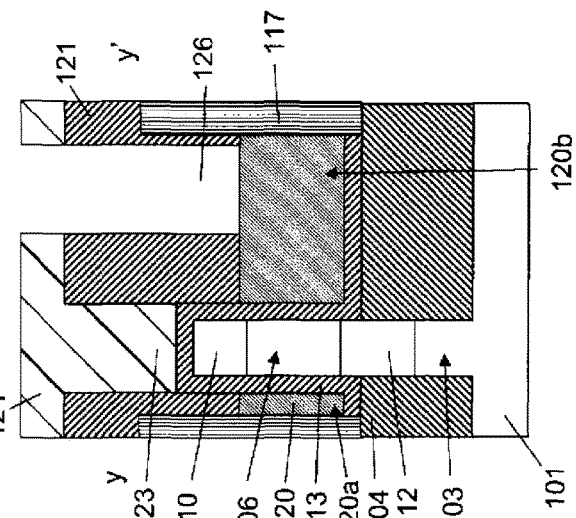
FIG. 35C is a sectional view taken along line Y-Y' in FIG. 35A.
Figure 35A:
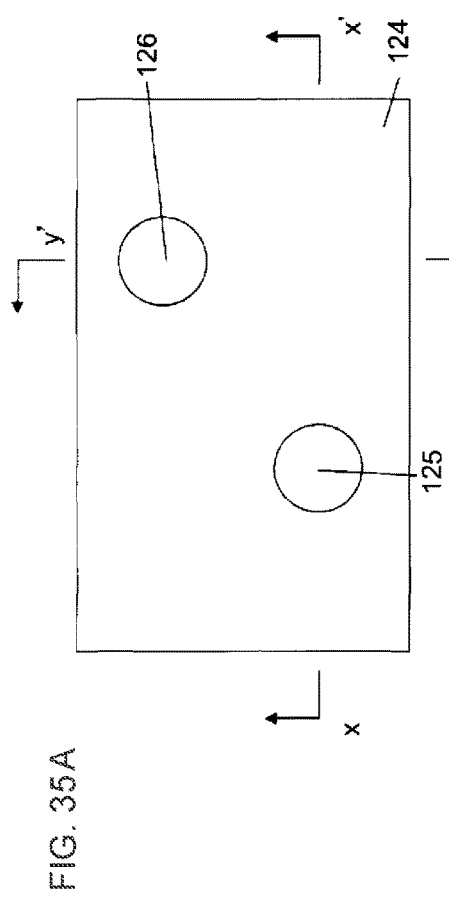
FIG. 35A is a plan view of a method for manufacturing a semiconductor device according to the present invention.
Figure 35B:
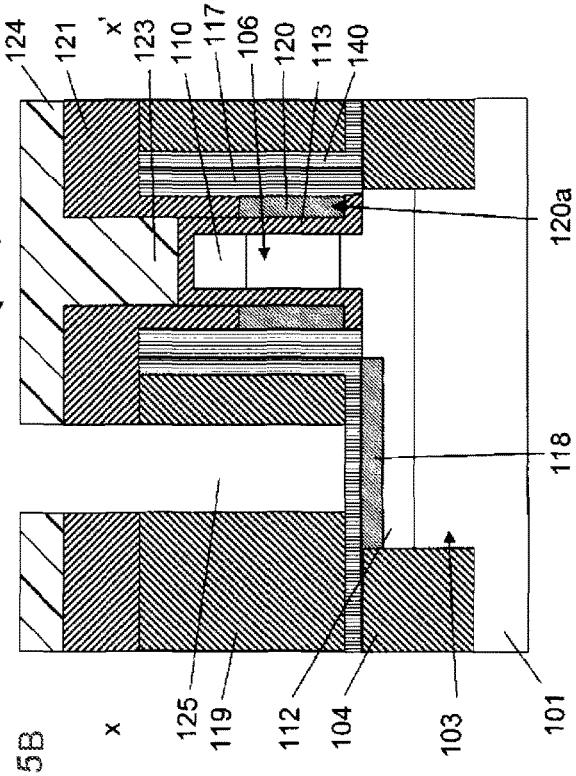
FIG. 35B is a sectional view taken along line X-X' in FIG. 35A.

As shown in FIGS. 35A-C, the interlayer insulating films 121 and 119 are etched to form contact holes 125 and 126.

As shown in FIGS. 36A-C, the fifth resist 124 is removed.

Figure 37A:
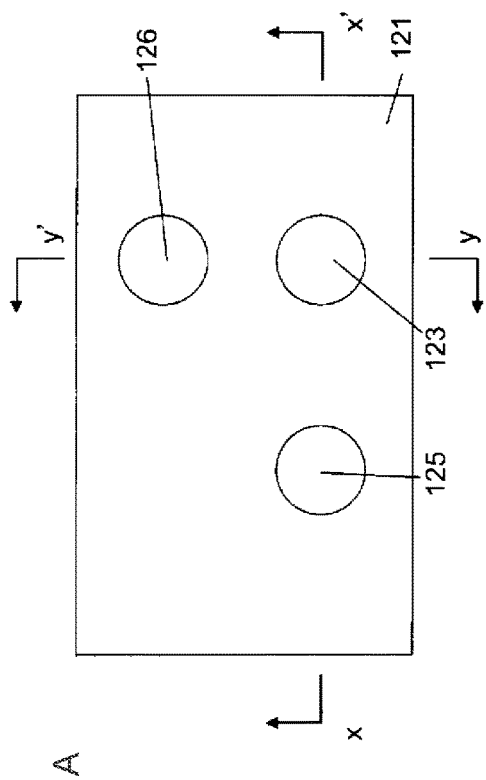
FIG. 37A is a plan view of a method for manufacturing a semiconductor device according to the present invention.
Figure 37C:
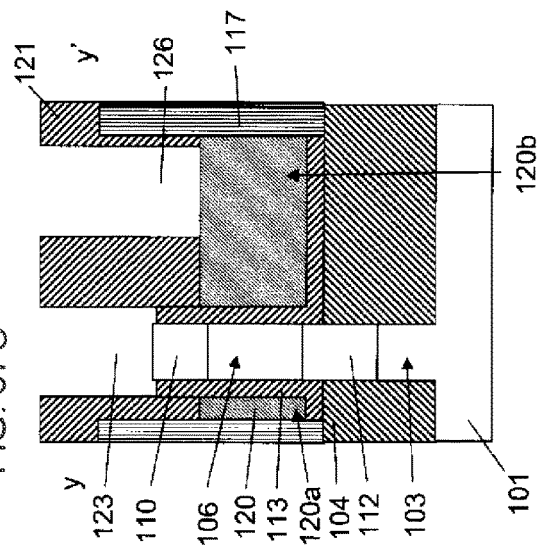
FIG. 37C is a sectional view taken along line Y-Y' in FIG. 37A.
Figure 37B:
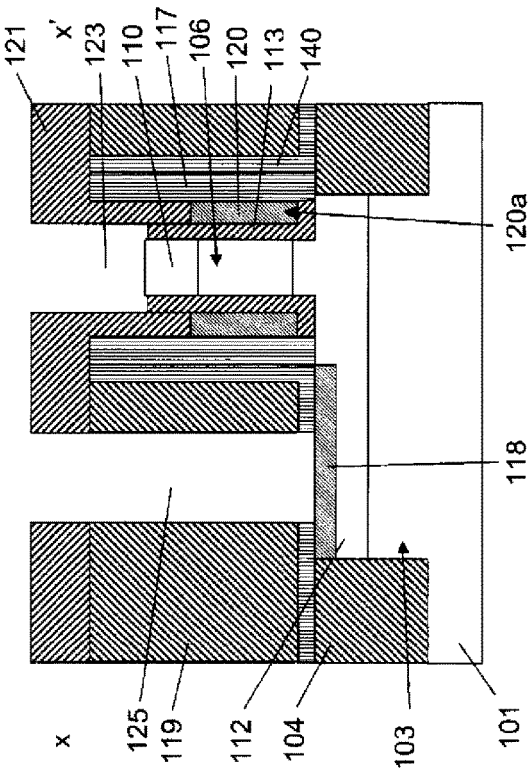
FIG. 37B is a sectional view taken along line X-X' in FIG. 37A.

As shown in FIGS. 37A-C, the nitride film 140 and the gate insulating film 113 is etched to expose the silicide 118 and the diffusion layer 110.

As shown in FIGS. 38A-C, a metal is deposited to form contacts 143, 127, and 128. The manufacturing method for forming contacts is described above. Since a silicide is not formed in the diffusion layer 110 in an upper portion of the pillar-shaped semiconductor layer 106, the contact 127 is brought into direct contact with the diffusion layer 110 in an upper portion of the pillar-shaped semiconductor layer 106.

Next, a manufacturing method for forming a metal wiring layer is described.

Figure 39C:
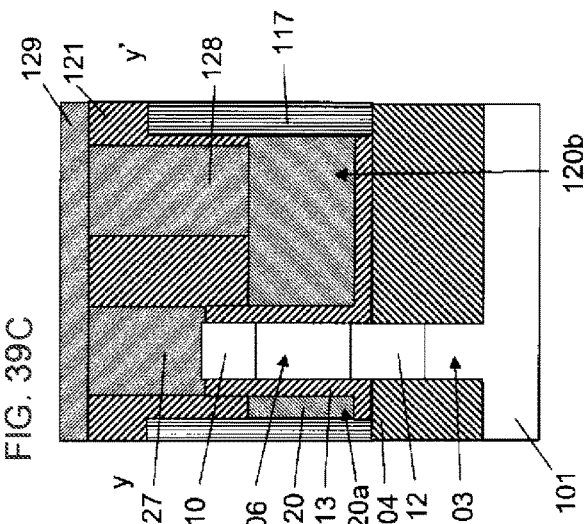
FIG. 39C is a sectional view taken along line Y-Y' in FIG. 39A.
Figure 39A:
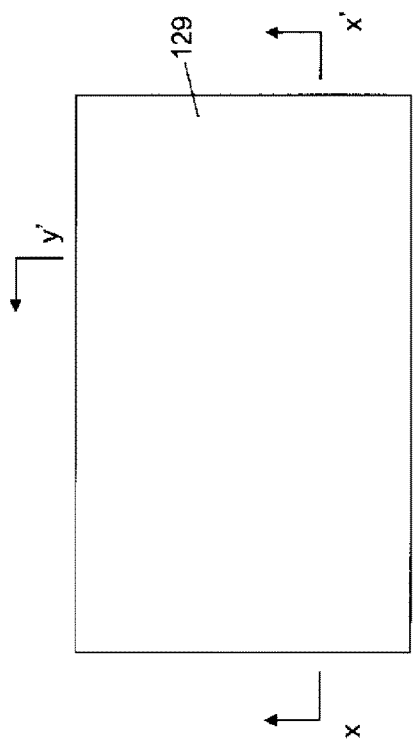
FIG. 39A is a plan view of a method for manufacturing a semiconductor device according to the present invention.
Figure 39B:
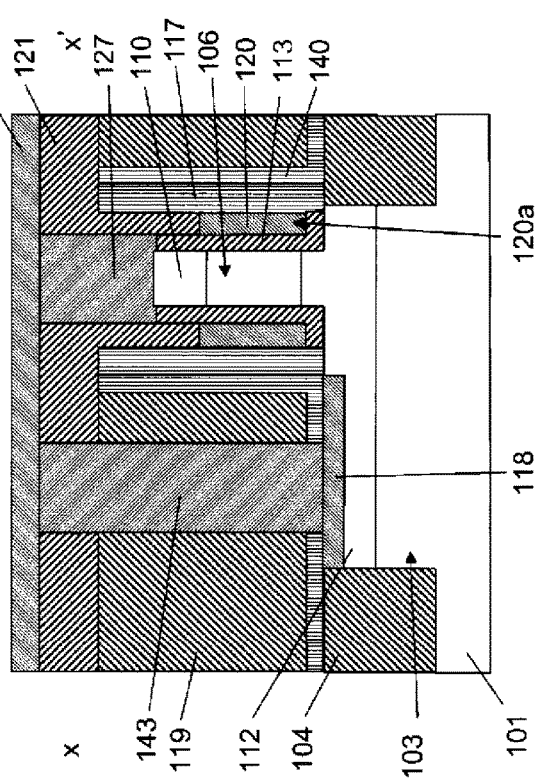
FIG. 39B is a sectional view taken along line X-X' in FIG. 39A.

As shown in FIGS. 39A-C, a metal 129 is deposited.

Figure 40A:
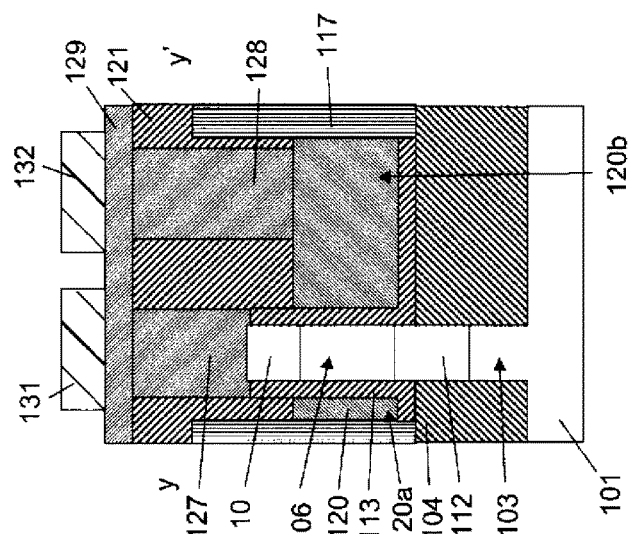
FIG. 40A is a plan view of a method for manufacturing a semiconductor device according to the present invention.
Figure 40C:
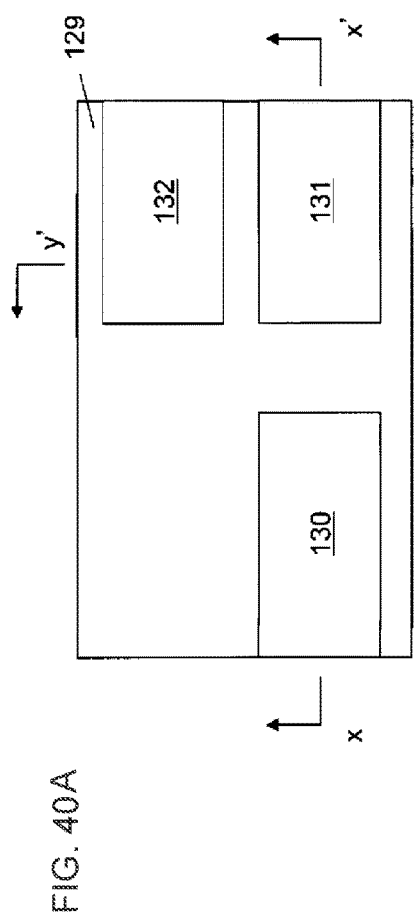
FIG. 40C is a sectional view taken along line Y-Y' in FIG. 40A.
Figure 40B:
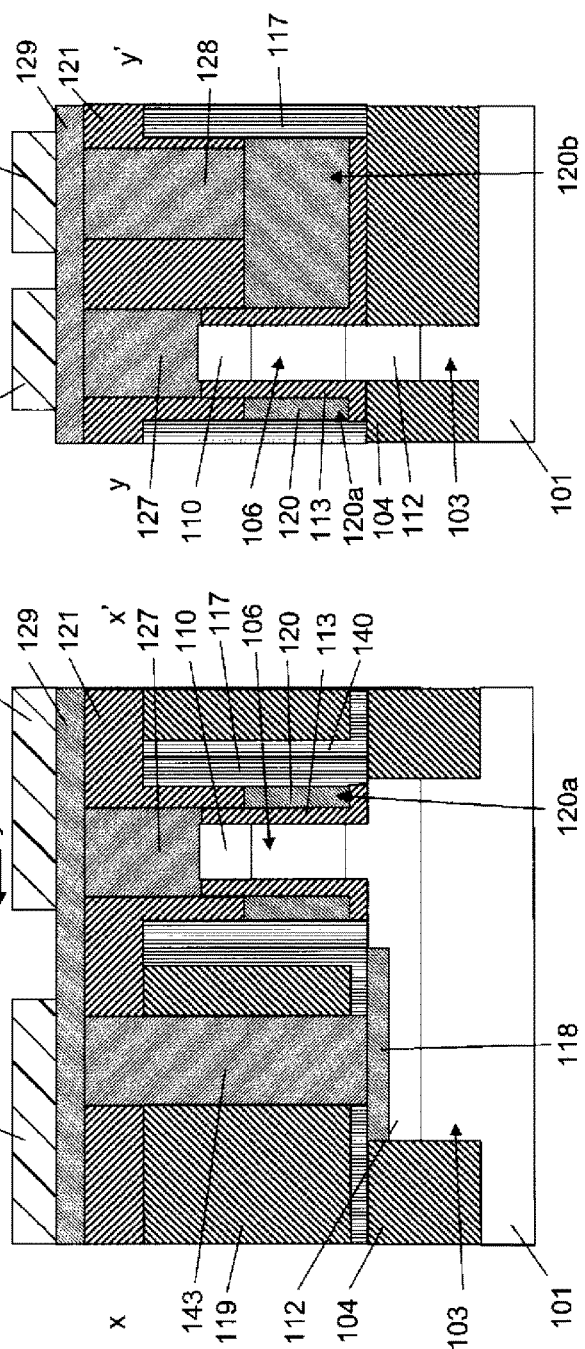
FIG. 40B is a sectional view taken along line X-X' in FIG. 40A.

As shown in FIGS. 40A-C, sixth resists 130, 131, and 132 are formed for forming the metal wiring.

As shown in FIGS. 41A-C, the metal 129 is etched to metal wirings 133, 134, and 135.

As shown in FIGS. 42A-C, the sixth resists 130, 131, and 132 are removed.

The manufacturing method for forming metal wiring layers is described above.

The result of the above-described manufacturing method is shown in FIGS. 1A-C.

The resulting structure includes: the fin-shaped semiconductor layer 103 formed on the substrate 101; the first insulating film 104 formed around the fin-shaped semiconductor layer 103; the pillar-shaped semiconductor layer 106 formed on the fin-shaped semiconductor layer 103, the width of the pillar-shaped semiconductor layer 106 being equal to the width of the fin-shaped semiconductor layer 103; the diffusion layer 112 formed in an upper portion of the fin-shaped semiconductor layer 103 and a lower portion of the pillar-shaped semiconductor layer 106; the diffusion layer 110 formed in an upper portion of the pillar-shaped semiconductor layer 106; the silicide 118 formed in an upper portion of the diffusion layer 112 in an upper portion of the fin-shaped semiconductor layer 103; the gate insulating film 113 formed around the pillar-shaped semiconductor layer 106; the metal gate electrode 120a formed around the gate insulating film; the metal gate wiring 120b connected to the metal gate electrode 120a and extending in a direction perpendicular to the fin-shaped semiconductor layer 103; and the contact 127 formed on the diffusion layer 110, the diffusion layer 110 and the contact 127 being in direct contact with each other.

As described above, it is possible to decrease a parasitic capacitance between a gate wiring and a substrate and provide a SGT manufacturing method using a gate-last process and a resulting SGT structure.

The invention claimed is:

1. A method for manufacturing a semiconductor device comprising:
    etching a semiconductor substrate to form a fin-shaped semiconductor layer;
    after forming the fin-shaped semiconductor layer, depositing a first insulating film around the fin-shaped semiconductor layer;
    etching back the first insulating film to expose an upper portion of the fin-shaped semiconductor layer;
    after etching back the first insulating film, forming a resist so as to be perpendicular to the fin-shaped semiconductor layer; and
    after forming the resist so as to be perpendicular to the fin-shaped semiconductor layer, etching the fin-shaped semiconductor layer to reduce the height of the fin-shaped semiconductor layer and to form a pillar-shaped semiconductor layer on the fin-shaped semiconductor layer, such that a portion where the fin-shaped semiconductor layer and the resist intersect at right angles defines the pillar-shaped semiconductor layer.

* * * * *